(12) United States Patent
Kurita et al.

(10) Patent No.: US 8,101,508 B2
(45) Date of Patent: Jan. 24, 2012

(54) SILICON SUBSTRATE AND MANUFACTURING METHOD THEREOF

(75) Inventors: Kazunari Kurita, Tokyo (JP); Shuichi Omote, Tokyo (JP)

(73) Assignee: Sumco Corporation, Tokyo (JP)

( * ) Notice: Subject to any disclaimer, the term of this patent is extended or adjusted under 35 U.S.C. 154(b) by 205 days.

(21) Appl. No.: 12/396,656

(22) Filed: Mar. 3, 2009

(65) Prior Publication Data

US 2009/0224367 A1 Sep. 10, 2009

(30) Foreign Application Priority Data

| Mar. 5, 2008 | (JP) | ................................ 2008-054840 |
| Mar. 5, 2008 | (JP) | ................................ 2008-054841 |

(51) Int. Cl.
*H01L 21/20* (2006.01)
*H01L 21/36* (2006.01)

(52) U.S. Cl. .......... 438/478; 257/E21.091; 257/E29.086

(58) Field of Classification Search .................. 438/478; 257/E21.091, E29.086
See application file for complete search history.

(56) References Cited

U.S. PATENT DOCUMENTS

| 4,160,985 | A | | 7/1979 | Kamins et al. |
| 4,247,859 | A | * | 1/1981 | Rai-Choudhury et al. ... 257/352 |
| 4,437,922 | A | * | 3/1984 | Bischoff et al. ............... 438/795 |
| 5,220,191 | A | * | 6/1993 | Matsushita .................... 257/499 |
| 5,419,786 | A | | 5/1995 | Kokawa et al. |
| 5,734,195 | A | | 3/1998 | Takizawa et al. |
| 5,874,348 | A | | 2/1999 | Takizawa et al. |
| 6,140,213 | A | | 10/2000 | Takizawa et al. |
| 6,277,501 | B1 | | 8/2001 | Fujikawa |
| 6,351,001 | B1 | | 2/2002 | Stevens et al. |
| 7,700,394 | B2 | * | 4/2010 | Sadamitsu et al. .............. 438/45 |
| 7,846,252 | B2 | * | 12/2010 | Umeno et al. ................... 117/13 |
| 2003/0170928 | A1 | | 9/2003 | Shimozono et al. |

FOREIGN PATENT DOCUMENTS

| EP | 0948037 | 10/1999 |
| JP | 6-338507 | 12/1994 |
| JP | 7-15981 | 2/1995 |
| JP | 2002-353434 | 12/2002 |
| JP | 2006-313922 | 11/2006 |
| KR | 1020060090516 | 8/2006 |

OTHER PUBLICATIONS

Korean Office Action that issued with respect to patent family member Korean Patent Application No. 2009-0018562, issued Feb. 8, 2011, along with an English language translation.
U.S. Appl. No. 12/397,399, filed Mar. 4, 2009, and entitled "Silicon Substrate and Manufacturing Method of the Same".
U.S. Appl. No. 12/396,631, filed Mar. 3, 2009, and entitled "Method of Manufacturing Silicon Substrate".
U.S. Appl. No. 12/391,723, filed Feb. 24, 2009, and entitled "Silicon Substrate and Manufacturing Method Thereof".

(Continued)

*Primary Examiner* — David S Blum
(74) *Attorney, Agent, or Firm* — Greenblum & Bernstein, PLC

(57) ABSTRACT

A silicon substrate is manufactured from a single crystal silicon that is doped with phosphorus (P) and is grown by a CZ method to have a predetermined carbon concentration and a predetermined initial oxygen concentration. An n+ epitaxial layer or an n+ implantation layer that is doped with phosphorus (P) at a predetermined concentration or more is formed on the silicon substrate. An n epitaxial layer that is doped with phosphorus (P) at a predetermined concentration is formed on the n+ layer.

4 Claims, 11 Drawing Sheets

OTHER PUBLICATIONS

"Chapter 1. Silicon: Single-Crystal Growth & Wafer Preparation", In: Wolf Stanley; Tauber Richard N: "Silicon Processing for the VLSI Era. vol. 1: Process Technology", Lattice Press, XP009147351, ISBN: 978-0-9616721-6-4 vol. 1, Nov. 1, 1999, pp. 1-34.

"Chapter 2—Crystalline Defects & Gettering ", In: Wolf Stanley; Tauber Richard N: "Silicon Processing for the VLSI Era. vol. 1: Process Technology", Lattice Press, XP009147355, ISBN: 978-09616721-6-4 vol. 1, Nov. 1, 1999, pp. 35-69.

Stallhofer P et al., "Oxygen and carbon measurements on silicon slices by the IR method", Solid State Technology, vol. 26, No. 8, XP001525740, 1983, pp. 233-237.

Search report from E.P.O. that issued with respect to patent family member European Patent Application No. 09003023.0, mail date is May 4, 2011.

* cited by examiner

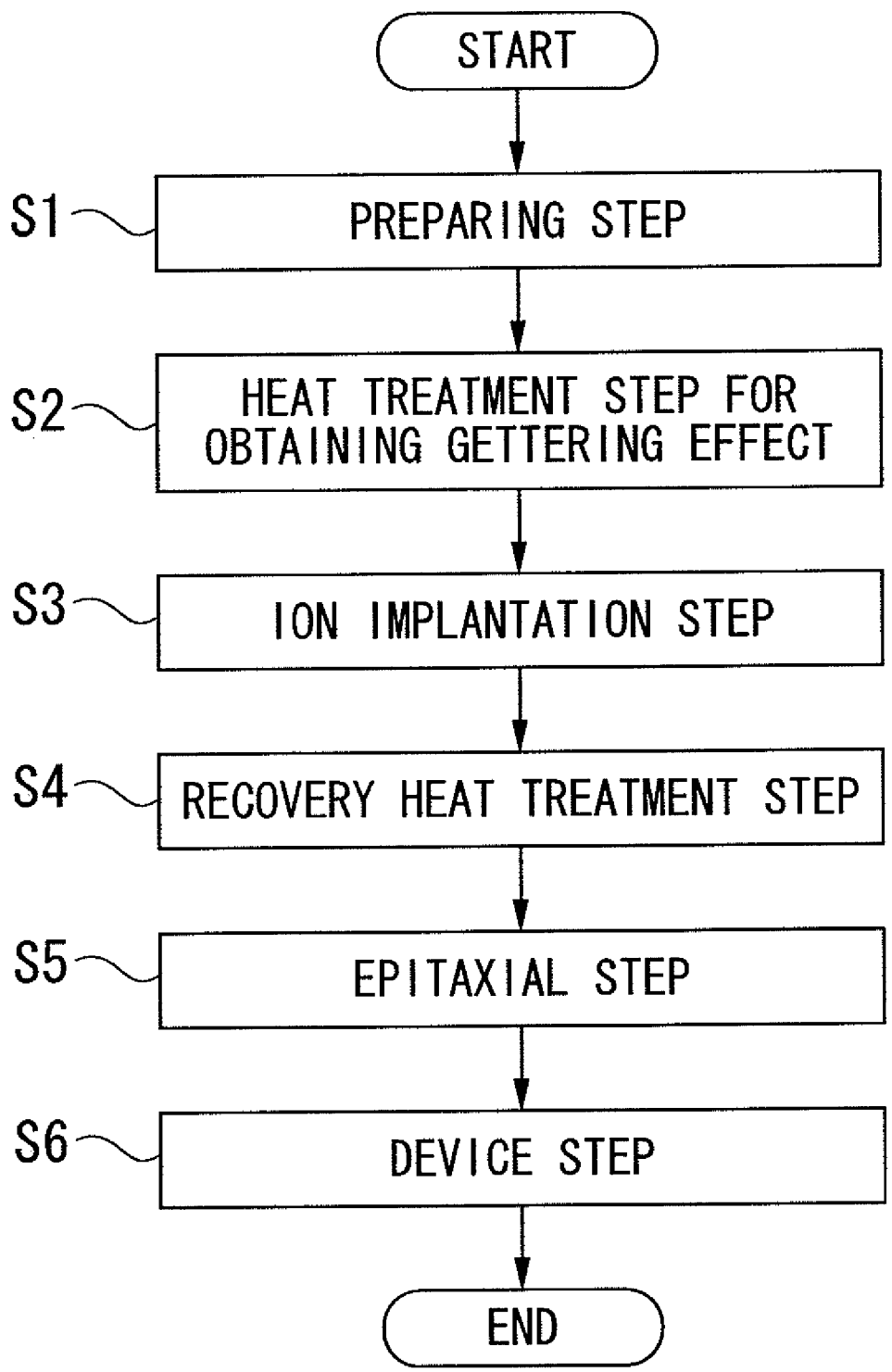

SILICON SUBSTRATE AND MANUFACTURING METHOD THEREOF

BACKGROUND OF THE INVENTION

1. Field of the Invention

The present invention relates to a silicon substrate and a method of manufacturing the same, and more particularly, to a technique applicable for a silicon substrate for a solid-state imaging device that has high gettering capability and is used to manufacture a solid-state imaging device.

Priority is claimed on Japanese Patent Application No. 2008-054840, filed Mar. 5, 2008, and Japanese Patent Application No. 2008-054841, filed Mar. 5, 2008, the content of which is incorporated herein by reference.

2. Description of Related Art

A solid-state imaging device is manufactured by slicing a single crystal silicon pulled by, for example, a CZ (Czochralski) method into a silicon substrate and forming a circuit on the silicon substrate. When impurities, such as heavy metal, are mixed with the silicon substrate, electrical characteristics of the solid-state imaging device significantly deteriorate due to, for example, the generation of white spots.

For example, impurities, such as heavy metal, are mixed with the silicon substrate by the following two causes: first, metal contamination during a process of manufacturing a silicon substrate including single crystal pulling, slice, chamfering, and surface treatments, such as, polishing, grinding, and etching; and second, heavy metal contamination during a solid-state imaging device manufacturing process of forming a circuit on the silicon substrate.

In the related art, the following methods have been used to prevent the mixture of heavy metal: an IG (intrinsic gettering) method of forming an oxygen precipitate on a silicon substrate; and an EG (extrinsic gettering) method of forming a gettering site, such as backside damage, on the rear surface of a silicon substrate.

A technique for implanting carbon ions in order to reduce white spots generated due to a dark current that has an effect on the electrical characteristics of a solid-state imaging device is disclosed in JP-A-6-338507 and JP-A-2002-353434. In addition, an example of the EG method is disclosed in JP-A-2006-313922 (paragraph [0005]). Further, a technique related to carbon ion implantation is disclosed in JP-A-2006-313922.

As such, a silicon substrate obtained by an intrinsic gettering method that performs an oxygen precipitate heat treatment before epitaxial growth to form an oxygen precipitate has been used for a solid-state imaging device. Alternatively, a silicon substrate obtained by an ion implantation method that implants ions, such as carbon ions, into a silicon substrate has been used for a solid-state imaging device.

However, when an n/n+/n substrate used for a device that is operated at high speed, such as a CCD (charge coupled device) or a CIS (CMOS image sensor) is manufactured, there is a problem in that device characteristics deteriorate. That is, when a solid-state imaging device is manufactured from a substrate having an n+ epitaxial silicon layer (or an n+ type layer) and an n epitaxial silicon layer formed on an n silicon CZ substrate, contaminated heavy metal is segregated on a portion of a photodiode, which is a main part of the solid-state imaging device, in which a charge is stored, that is, a portion of the n+ epitaxial silicon layer (or the n+ type layer) serving as a phosphorus getter. As a result, device characteristics deteriorate.

In this case, the n type (n) corresponds to a phosphorus (P) concentration in the range of about $1.0 \times 10^{16}$ atoms/cm$^3$ to $1.0 \times 10^{18}$ atoms/cm$^3$. The n+ type (n+) corresponds to a phosphorus (P) concentration in the range of about $1.0 \times 10^{18}$ atoms/cm$^3$ to $1.0 \times 10^{20}$ atoms/cm$^3$. The n− type (n−) corresponds to a phosphorus (P) concentration in the range of about $1.0 \times 10^{14}$ atoms/cm$^3$ to $1.0 \times 10^{16}$ atoms/cm$^3$. The n+ type corresponds to a resistivity in the range of about $8 \times 10^{-3}$ Ωcm to $10 \times 10^{-3}$ Ωcm. The n− type corresponds to a resistivity in the range of about 0.1 Ωcm to 100 Ωcm. An n++ type (n++) corresponds to a resistivity in the range of about $0.1 \times 10^{-3}$ Ωcm to $0.01 \times 10^{-3}$ Ωcm.

In the intrinsic gettering method, it is necessary to form an oxygen precipitate in a silicon substrate in advance. Therefore, the intrinsic gettering method requires multi-stage heat treatment processes, which result in an increase in manufacturing costs. In addition, in the intrinsic gettering method, a heat treatment needs to be performed at a high temperature for a long time. Therefore, there is a concern that the metal contamination of a silicon substrate will increase during a heat treatment process or between the heat treatment processes.

On the other hand, in the extrinsic gettering method, for example, backside damage is formed on the rear surface of a silicon substrate. That is, in the extrinsic gettering method, metal contamination occurs during a manufacturing process, which results in a device defect.

When a high-temperature heat treatment is performed on a carbon-implanted substrate as in JP-A-2002-353434, crystal defects (for example, crystal lattice strain) formed by carbon implantation are reduced. As a result, the function of gettering sinks is likely to deteriorate.

For example, any of the following silicon substrates is used for a solid-state imaging device: a silicon substrate obtained by an intrinsic gettering method that performs an oxygen precipitate heat treatment before epitaxial growth to form an oxygen precipitate; and a silicon substrate obtained by an ion implantation method that implants ions, such as carbon ions, into a silicon substrate. There is a concern that heavy metal contamination will occur in both of the two kinds of substrates while the silicon substrates are manufactured. On the other hand, in the silicon substrate obtained by the extrinsic gettering method, for example, backside damage is formed on the rear surface thereof. Therefore, in the case of the silicon substrate obtained by the extrinsic gettering method, particles are generated from the rear surface of the silicon substrate during a device process, which results in a device defect.

When a gettering layer is formed on the silicon substrate by implanting ions, such as carbon ions, for example, carbon, serving as a gettering sink, tends to be diffused by a heat treatment of the subsequent process, such as the device process, and carbon concentration tends to be lowered. As a result, the silicon substrate does not have sufficient gettering capability.

SUMMARY OF THE INVENTION

The present invention has been made in order to solve the above-mentioned problems, and an object of the present invention is to provide a silicon substrate and a method of manufacturing the same capable of reducing manufacturing costs, preventing the lowering of the gettering capability of a solid-state imaging device during a device process, improving the reliability of the gettering capability of a solid-state imaging device, reducing metal contamination of a solid-state imaging device, and improving the yield of a solid-state imaging device.

According to an aspect of the present invention, there is provided a first silicon substrate manufactured from a single crystal silicon that is doped with phosphorus (P) and is grown by a CZ method to have a carbon concentration that is greater than or equal to $1.0\times10^{16}$ atoms/cm$^3$ and less than or equal to $1.6\times10^{17}$ atoms/cm$^3$ and an initial oxygen concentration that is greater than or equal to $1.4\times10^{18}$ atoms/cm$^3$ and less than or equal to $1.6\times10^{18}$ atoms/cm$^3$. The first silicon substrate includes: an n+ epitaxial layer that is doped with phosphorus (P) at a concentration greater than or equal to $1.0\times10^{18}$ atoms/cm$^3$ and is formed on the first silicon substrate; and an n epitaxial layer that is doped with phosphorus (P) at a concentration greater than or equal to $1.0\times10^{16}$ atoms/cm$^3$ and less than or equal to $1.0\times10^{18}$ atoms/cm$^3$ and is formed on the n+ epitaxial layer.

In the first silicon substrate according to the above-mentioned aspect, preferably, the thickness of the n+ epitaxial layer is greater than or equal to 0.2 µm and less than or equal to 0.6 µm.

In the first silicon substrate according to the above-mentioned aspect, preferably, the thickness of the n epitaxial layer is greater than or equal to 2 µm and less than or equal to 10 µm.

According to another aspect of the present invention, there is provided a method of manufacturing a first silicon substrate. The method includes: a first preparation step of growing a single crystal silicon that is doped with phosphorus (P) and has a carbon concentration that is greater than or equal to $1.0\times10^{16}$ atoms/cm$^3$ and less than or equal to $1.6\times10^{17}$ atoms/cm$^3$ and an initial oxygen concentration that is greater than or equal to $1.4\times10^{18}$ atoms/cm$^3$ and less than or equal to $1.6\times10^{18}$ atoms/cm$^3$ using a CZ method, and slicing the single crystal silicon; a step of forming an n+ epitaxial layer that is doped with phosphorus (P) at a concentration greater than or equal to $1.0\times10^{19}$ atoms/cm$^3$ on the sliced single crystal silicon; and a step of forming a first n epitaxial layer that is doped with phosphorus (P) at a concentration greater than or equal to $1.0\times10^{16}$ atoms/cm$^3$ and less than or equal to $1.0\times10^{18}$ atoms/cm$^3$ on the n+ epitaxial layer.

In the method of manufacturing a first silicon substrate according to the above-mentioned aspect, preferably, the thickness of the n+ epitaxial layer is greater than or equal to 0.2 µm and less than or equal to 0.6 µm.

In the method of manufacturing a first silicon substrate according to the above-mentioned aspect, preferably, the thickness of the n epitaxial layer is greater than or equal to 2 µm and less than or equal to 10 µm.

According to still another aspect of the present invention, a first silicon substrate for a solid-state imaging device was manufactured by the manufacturing method according to the above-mentioned aspect.

The oxygen concentration was measured by an ASTM F121-1979.

The carbon concentration was measured by infrared absorption measurement.

The n (n type), n+ (n+ type), and n− (n− type) phosphorus (P) concentrations were measured by a secondary ion mass spectrometer.

The n, n+, and n− resistivities were measured by a 4-probe resistivity measuring device.

The first silicon substrate according the above-mentioned aspect of the present invention that is suitable to manufacture a solid-state imaging device has precipitate nuclei (gettering sinks of heavy metal) by the addition of carbon, and includes a silicon epitaxial layer formed thereon.

When the first silicon substrate is used to manufacture a solid-state imaging device, it is possible to getter heavy metal in a portion of the substrate doped with carbon and prevent contaminated heavy metal from being segregated on the n+ epitaxial layer, serving as a phosphorus getter. In this way, it is possible to prevent the occurrence of defects in a transistor and a buried photodiode of the solid-state imaging device due to heavy metal contamination, and it is possible to prevent the generation of, for example, white spots in the solid-state imaging device. As a result, it is possible to improve the yield of a solid-state imaging device.

According to another aspect of the present invention, there is provided a second silicon substrate manufactured from a single crystal silicon that is doped with phosphorus (P) and is grown by a CZ method to have a carbon concentration that is greater than or equal to $1.0\times10^{16}$ atoms/cm$^3$ and less than or equal to $1.6\times10^{17}$ atoms/cm$^3$ and an initial oxygen concentration that is greater than or equal to $1.4\times10^{18}$ atoms/cm$^3$ and less than or equal to $1.6\times10^{18}$ atoms/cm$^3$. The second silicon substrate includes: an n+ implantation layer that is doped with an n-type dopant at a concentration greater than or equal to $1.0\times10^{18}$ atoms/cm$^3$ by ion implantation and is formed on the second silicon substrate; and an n epitaxial layer that is doped with an n-type dopant at a concentration greater than or equal to $1.0\times10^{16}$ atoms/cm$^3$ and less than or equal to $1.0\times10^{17}$ atoms/cm$^3$ and is formed on the n+ implantation layer.

In the second silicon substrate according to the above-mentioned aspect, preferably, the thickness of the n+ implantation layer is greater than or equal to 0.2 µm and less than or equal to 0.6 µm.

In the second silicon substrate according to the above-mentioned aspect, preferably, the thickness of the n epitaxial layer is greater than or equal to 2 µm and less than or equal to 10 µm.

According to another aspect of the present invention, there is provided a method of manufacturing a second silicon substrate. The method includes: a second preparation step of growing a single crystal silicon that is doped with phosphorus (P) and has a carbon concentration that is greater than or equal to $1.0\times10^{16}$ atoms/cm$^3$ and less than or equal to $1.6\times10^{17}$ atoms/cm$^3$ and an initial oxygen concentration that is greater than or equal to $1.4\times10^{18}$ atoms/cm$^3$ and less than or equal to $1.6\times10^{18}$ atoms/cm$^3$ using a CZ method, and slicing the single crystal silicon; an implantation step of implanting an n-type dopant into the surface of the sliced single crystal silicon at a concentration greater than or equal to $1.0\times10^{18}$ atoms/cm$^3$ to form an n+ implantation layer; and an epitaxial step of forming a second n epitaxial layer that is doped with an n-type dopant at a concentration greater than or equal to $1.0\times10^{16}$ atoms/cm$^3$ and less than or equal to $1.0\times10^{18}$ atoms/cm$^3$ on the n+ implantation layer.

In the method of manufacturing a second silicon substrate according to the above-mentioned aspect, preferably, the thickness of the n+ implantation layer is greater than or equal to 0.2 µm and less than or equal to 0.6 µm.

In the method of manufacturing a second silicon substrate according to the above-mentioned aspect, preferably, the thickness of the second n epitaxial layer is greater than or equal to 2 µm and less than or equal to 10 µm.

Preferably, the method of manufacturing a second silicon substrate according to the above-mentioned aspect further includes a recovery heat treatment step that is performed at a temperature greater than or equal to 950° C. and less than or equal to 1200° C. after the implantation step.

Preferably, the method of manufacturing a second silicon substrate according to the above-mentioned aspect further includes a heat treatment step for obtaining a gettering effect that is performed at a temperature greater than or equal to 600° C. and less than or equal to 800° C. for a time of 15 minutes to 4 hours after the second preparation step.

According to another aspect of the present invention, a second silicon substrate for a solid-state imaging device is manufactured by the method of manufacturing a second silicon substrate according to the above-mentioned aspect.

The second silicon substrate according the above-mentioned aspect of the present invention that is suitable to manufacture a solid-state imaging device has precipitate nuclei (gettering sinks of heavy metal) by the addition of carbon, and includes a silicon epitaxial layer formed thereon.

When the second silicon substrate is used to manufacture a solid-state imaging device, it is possible to getter heavy metal in a portion of the substrate doped with carbon and prevent contaminated heavy metal from being segregated on the n+ implantation layer, serving as a phosphorus getter. In addition, a gettering portion is not formed by ion implantation, but is formed over the entire thickness of the substrate before an epitaxial layer is formed. Therefore, in the second silicon substrate, it is possible to prevent carbon from being diffused by a heat treatment of the subsequent process and prevent the concentration of carbon from being lowered. As a result, it is possible to prevent a reduction in gettering capability. In this way, it is possible to prevent the occurrence of defects in a transistor and a buried photodiode of the solid-state imaging device due to heavy metal contamination, and it is possible to prevent the generation of, for example, white spots in the solid-state imaging device. As a result, it is possible to improve the yield of a solid-state imaging device.

Therefore, according to the above-mentioned aspects of the present invention, it is possible to maintain a high gettering capability. As a result, it is possible to provide a first silicon substrate and a second silicon substrate capable of reducing the influence of metal contamination. The silicon substrates and the manufacturing methods thereof make them possible to reduce manufacturing costs and prevent the generation of particles in the device step.

BRIEF DESCRIPTION OF THE DRAWINGS

FIG. 13 is a flowchart illustrating the method of manufacturing the second silicon substrate according to the embodiment of the present invention.

DETAILED DESCRIPTION OF THE INVENTION

First Embodiment

Figure 1A:
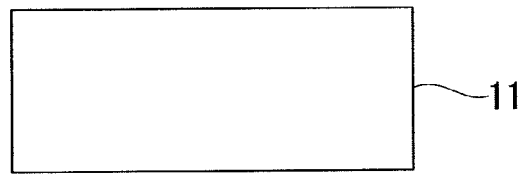
FIGS. 1A to 1D are front cross-sectional views illustrating a method of manufacturing a first silicon substrate according to an embodiment of the present invention.

Hereinafter, a silicon substrate according to a first embodiment of the present invention will be described with reference to the accompanying drawings.

FIGS. 1A to 1D are front cross-sectional views illustrating a silicon substrate in each step of a method of manufacturing a first silicon substrate according to the first embodiment. In FIGS. 1A to 1D, reference numeral 11 denotes a silicon substrate.

In order to obtain the silicon substrate 11 shown in FIGS. 1A to 1D, first, polysilicon, which is a raw material of a single crystal silicon, is placed in a vitreous silica crucible, and a predetermined amount of graphite powder is applied on the surface of the polysilicon. At the same time, boron (B) is injected as a dopant, and a CZ crystal having carbon added thereto is pulled up in a hydrogen atmosphere by the Czochralski method (CZ method), which will be described below.

The CZ crystal is a single crystal silicon that is manufactured by the Czochralski method and includes a magnetic field-applied CZ crystal.

In this embodiment, a p type single crystal silicon including boron is manufactured as follows. Carbon is added to a raw material to make a carbon-added raw material, and a single crystal silicon is produced from the carbon-added raw material. Then, the oxygen concentration Oi of the single crystal silicon is controlled to pull the single crystal silicon. The silicon substrate 11 including baron shown in FIG. 1A is obtained from the carbon-added high-concentration boron CZ single crystal silicon.

A general method is performed to process the silicon substrate (wafer) 11. That is, a cutting apparatus, such as an ID saw or a wire saw, is used to slice a single crystal silicon to obtain a silicon wafer. Then, annealing is performed on the obtained silicon wafer, and then surface treatments, such as polishing and cleaning, are performed on the silicon wafer. In addition to these processes, there are various processes, such as wrapping, cleaning, and grinding. The order of the processes may be changed, and the processes may be appropriately omitted for the purpose of use.

The obtained silicon substrate 11 has a phosphorus (P) concentration corresponding to an n type. Carbon concentration is greater than or equal to $1.0 \times 10^{16}$ atoms/cm$^3$ and less than or equal to $1.6 \times 10^{17}$ atoms/cm$^3$. Oxygen concentration is greater than or equal to $1.4 \times 10^{18}$ atoms/cm$^3$ and less than or equal to $1.6 \times 10^{18}$ atoms/cm$^3$.

The carbon concentration is preferably greater than or equal to $1.0 \times 10^{16}$ atoms/cm$^3$ and less than or equal to $1.6 \times 10^{17}$ atoms/cm$^3$, and more preferably, greater than or equal to $1.0 \times 10^{16}$ atoms/cm$^3$ and less than or equal to $1.0 \times 10^{17}$ atoms/cm$^3$.

Since carbon in a solid solution state is included in silicon, carbon is introduced into a silicon lattice so as to be substituted for silicon. That is, the radius of a carbon atom is smaller than that of a silicon atom. Therefore, when carbon is disposed at a substitution position, the stress field of a crystal becomes a compression stress field, and interstitial oxygen and impurities are likely to be gettered in the compression stress field. For example, in a device step, a high-density oxygen precipitate involving dislocation is likely to be generated from carbon at the substitution position, and it is possible to give a high gettering effect to the silicon substrate 11.

It is necessary to regulate the concentration of carbon added in the above-mentioned range. The reason is that, if the carbon concentration is less than the above-mentioned range, the formation of an oxygen/carbon-based precipitate is not accelerated and the above-mentioned high-density oxygen/carbon-based precipitate is not formed.

On the other hand, if the carbon concentration is greater than the above-mentioned range, the formation of an oxygen/carbon-based precipitate is accelerated, and a high-density oxygen/carbon-based precipitate is obtained. When the size of the precipitate is regulated, strain around the precipitate tends to be reduced. Therefore, the effect of strain is reduced, and the effect of gettering impurities is reduced.

Furthermore, it is necessary to regulate the oxygen concentration in the silicon substrate 11 in the above-mentioned range. The reason is that, if the oxygen concentration is less than the above-mentioned range, the formation of a carbon/oxygen-based precipitate is not accelerated and the above-mentioned high-density precipitate is not obtained.

On the other hand, if the oxygen concentration is greater than the above-mentioned range, the size of an oxygen precipitate is decreased, and the effect of strain in an interface between a maternal silicon atom and a precipitate is reduced. As a result, a gettering effect due to strain is reduced.

The carbon concentration and the oxygen concentration make it possible to accelerate the formation of a composite defect of carbon and oxygen in an n type silicon substrate including an oxygen precipitate lightly doped with phosphorus, as compared to a p type silicon substrate doped with, for example, boron (B). As a result, it is possible to obtain sufficient gettering capability.

Figure 1B:
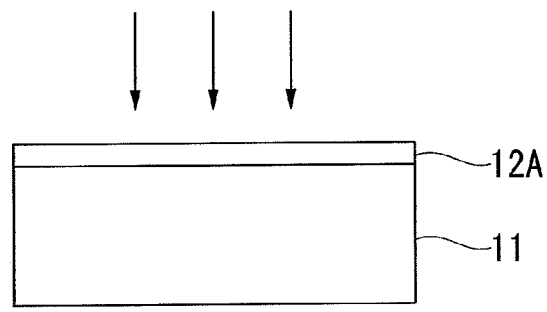

Then, mirror processing is performed on the surface of the silicon substrate 11, which is a carbon-added CZ crystal, and RCA cleaning, which is a combination of, SC1 and SC2, is performed on the silicon substrate in order to grow an epitaxial layer. Then, as shown in FIG. 1B, the silicon substrate 11 is put into an epitaxial growth furnace, and various CVD (chemical vapor deposition) methods are used to grow an n+ epitaxial layer 12A.

In this embodiment, it is preferable that the thickness of the n+ epitaxial layer 12A be greater than or equal to 0.1 µm and less than or equal to 0.6 µm in terms of the spectral sensitivity characteristics of a solid-state imaging device.

Figure 6:
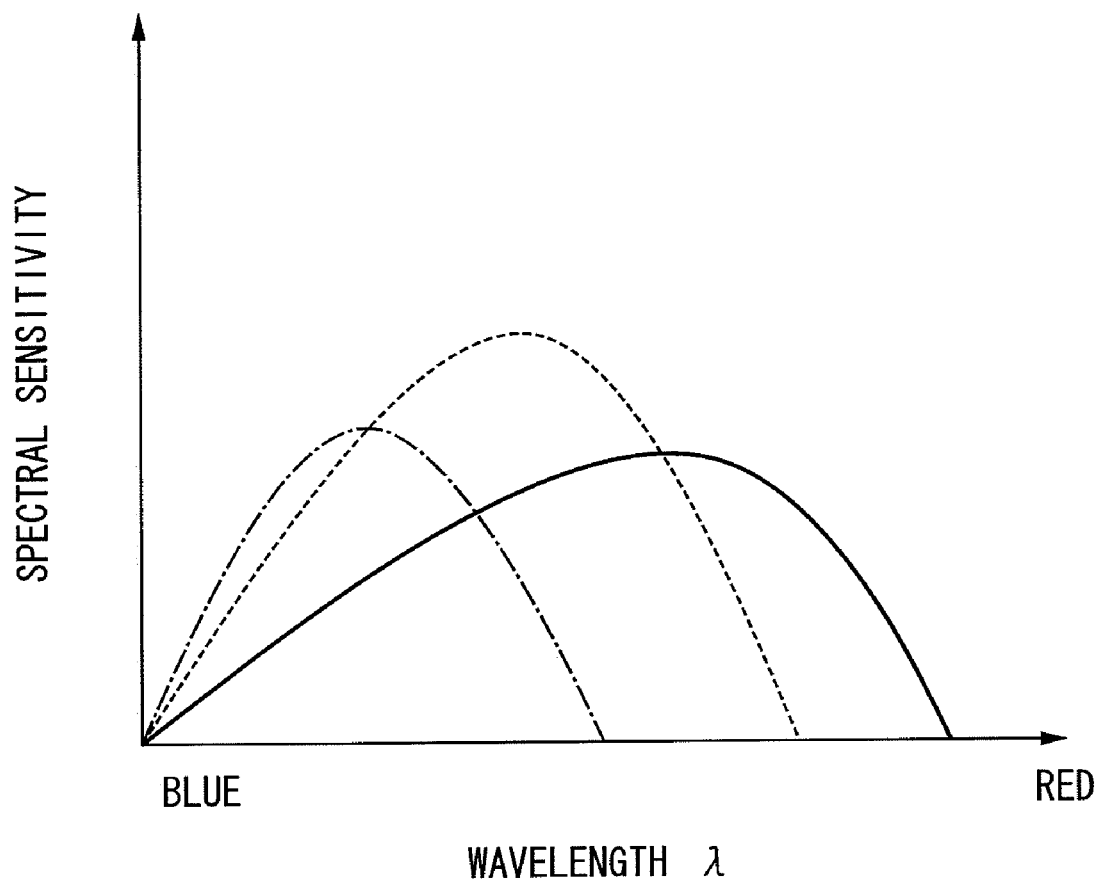
FIG. 6 is a diagram illustrating spectral characteristics of a solid-state imaging device obtained by the first silicon substrate.

In this embodiment, the thickness of the n+ epitaxial layer 12A is determined by the spectral sensitivity characteristics of a solid-state imaging device. As shown in FIG. 6, it is preferable that the spectral sensitivity characteristics of the solid-state imaging device correspond to when the peak of the wavelength detected by the solid-state imaging device has short wavelength characteristics represented by a one-dot chain line, when the peak of the wavelength detected by the solid-state imaging device corresponds to visible light represented by a dashed line, and when the peak of the wavelength detected by the solid-state imaging device corresponds to an infrared ray represented by a solid line. The spectral sensitivity characteristics are set in the range from when the thickness of the epitaxial layer is small to when the thickness of the epitaxial layer is large. It is preferable that the thickness of the epitaxial layer be in the above-mentioned range.

Figure 1C:
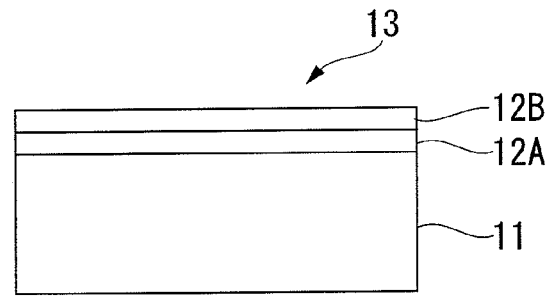

Then, similarly, as shown in FIG. 1C, an n epitaxial layer 12B is grown on the n+ epitaxial layer 12A.

In this case, it is preferable that the thickness of the n epitaxial layer 12B be greater than or equal to 2 µm and less than or equal to 10 µm in terms of the spectral sensitivity characteristics of the solid-state imaging device.

Figure 1D:
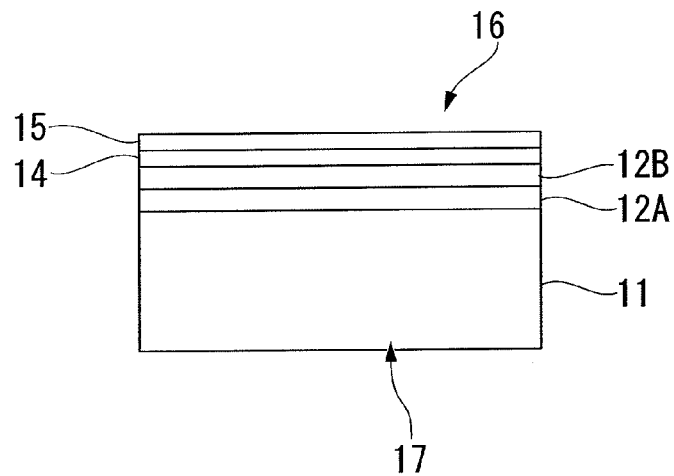

As shown in FIG. 1D, an oxide film 14 and a nitride film (polysilicon gate film) 15 are formed on the epitaxial layer 12B of an n/n+/n type first silicon substrate (semiconductor substrate) 13 having the epitaxial layer 12A and the epitaxial layer 12B formed thereon, if necessary, and the silicon substrate is provided to a device step, which will be described below. Then, in the device step, a buried photodiode is formed in the epitaxial layer 12B to manufacture a solid-state imaging device 16.

It is preferable that the thicknesses of the oxide film 14 and the nitride film 15 be determined considering restrictions in the design of the driving voltage of a transmission transistor. Specifically, it is preferable that the thickness of the oxide film 14 be greater than or equal to 50 nm and less than or equal to 100 nm. In addition, it is preferable that the thickness of the nitride film 15, specifically, the thickness of the polysilicon gate film 15 of the solid-state imaging device be greater than or equal to 1.0 µm and less than or equal to 2.0 µm.

In this case, the silicon substrate 11 of the first silicon substrate 13 supplied to the device step is a CZ crystal including a dopant and solute carbon. An oxygen precipitate nucleus or an oxygen precipitate formed in the CZ crystal during crystal growth is shrunken by a heat treatment when epitaxial growth is performed. Therefore, the oxygen precipitate formed in the silicon substrate 11 in the stage of the first silicon substrate 13 is not observed by an optical microscope.

Then, in order to ensure gettering sinks for gettering heavy metal, after the epitaxial layer 12A and the epitaxial layer 12B are grown, it is possible to accelerate the formation of an oxygen precipitate under the following conditions. It is preferable that a low-temperature heat treatment be performed at a temperature that is greater than or equal to 600° C. and less than or equal to 800° C. for a period of time that is greater than or equal to 0.25 hour and less than or equal to 3 hours to deposit an oxygen precipitate 17 which is the carbon/oxygen-based precipitate from carbon at a substitution position.

In the present invention, the carbon/oxygen-based precipitate is a complex (cluster) including at least carbon.

If the first silicon substrate 13 including solute carbon is used as a base material, the oxygen precipitate 17 is spontaneously precipitated from the entire first silicon substrate 13 in an initial stage of the device step. Therefore, in the device step, it is possible to form gettering sinks having high gettering capability for metal contamination over the entire thickness of the silicon substrate 11 from immediately below the epitaxial layer. As a result, gettering is performed near the epitaxial layer.

In order to achieve the gettering, it is preferable that the oxygen precipitate (BMD: Bulk Micro Defect) 17, which is a carbon/oxygen-based complex, have a size greater than or equal to 10 nm and less than or equal to 100 nm and a density greater than or equal to $1.0 \times 10^6$ BMDs/cm$^3$ and less than or equal to $1.0 \times 10^{11}$ BMDs/cm$^3$ in the silicon substrate 11.

In this case, the BMD size means the length of the diagonal line of a precipitate in the cross-sectional TEM image of the silicon substrate in the thickness direction, and indicates the average value of the precipitates in an observation field.

If the size of the oxygen precipitate 17 is greater than or equal to the lower limit of the above-mentioned range, it is possible to increase the probability of gettering interstitial impurities (for example, heavy metal) using the effect of strain occurring in an interface between a maternal silicon atom and the oxygen precipitate. On the other hand, if the size of the oxygen precipitate 17 is greater than or equal to the above-mentioned range, the strength of the substrate is lowered or dislocation occurs in the epitaxial layer, which is not preferable.

It is preferable that the density of the oxygen precipitate 17 in the silicon substrate be in the above-mentioned range since the gettering of heavy metal in the silicon crystal depends on strain occurring in the interface between the maternal silicon atom and the oxygen precipitate and an interface level density (volume density).

As the device step, a general solid-state imaging device manufacturing process can be used. For example, a CCD manufacturing process is shown in FIGS. 2A to 2F, but the present invention is not limited thereto.

Figure 2A:
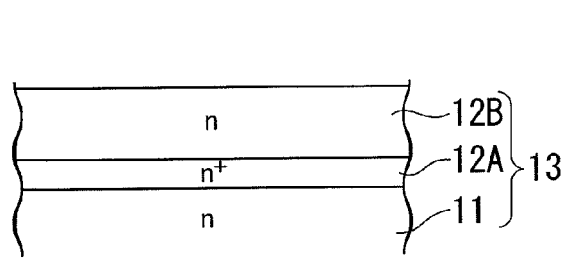
FIGS. 2A to 2F are front cross-sectional views illustrating a process of manufacturing a solid-state imaging device using the first silicon substrate.
Figure 2B:
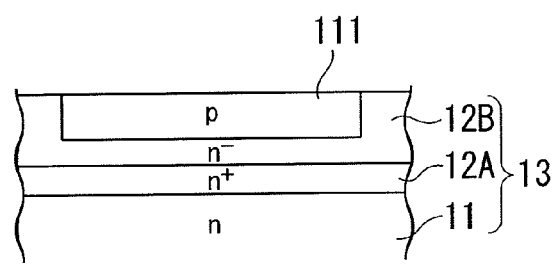
Figure 2C:
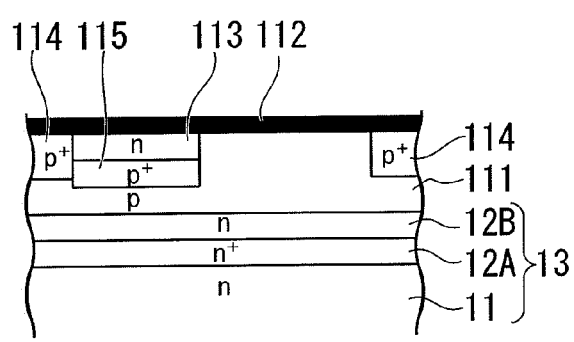

That is, in the device step, first, as shown in FIG. 2A, the first silicon substrate 13 having the n+ epitaxial layer 12A and the n epitaxial layer 12B formed on the silicon substrate 11 shown in FIG. 1C is prepared. Then, as shown in FIG. 2B, a first p type well region 111 is formed at a predetermined position of the epitaxial layer 12B. Then, as shown in FIG. 2C, a gate insulating film 112 is formed thereon, and n type and p type impurities are selectively implanted into the first p type well region 111 by ion implantation to form an n type transmission channel region 113, a p type channel stop region 114, and a second p type well region 115 forming a vertical transmission register.

Figure 2D:
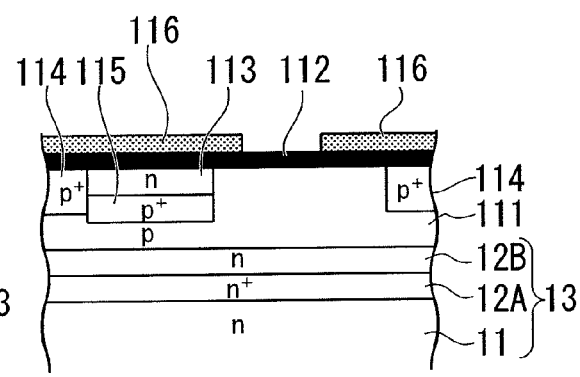
Figure 2E:
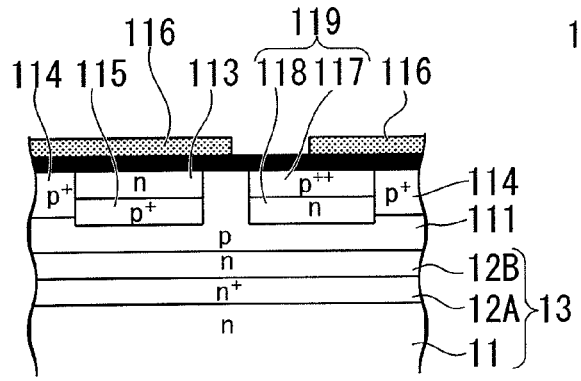

Then, as shown in FIG. 2D, transmission electrodes 116 are formed at predetermined positions on the surface of the gate insulating film 112. Then, as shown in FIG. 2E, n type and p type impurities are selectively implanted between the n type transmission channel region 113 and the second p type well region 115 to form a photodiode 119 having a laminated structure of a p type positive charge storage region 117 and an n type impurity diffusion region 118.

Figure 2F:
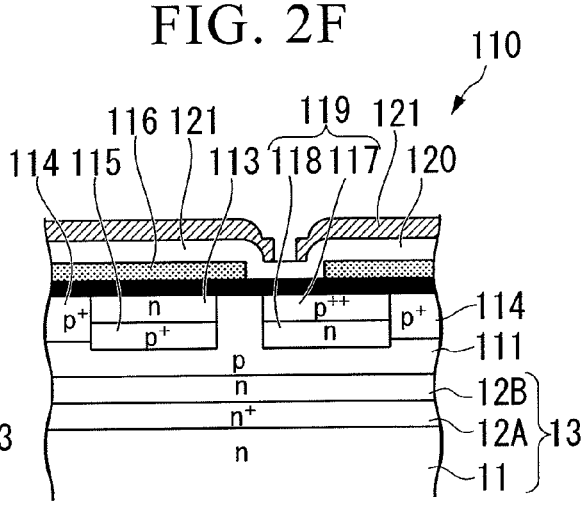

Then, as shown in FIG. 2F, an interlayer insulating film 120 is formed thereon, and a light-shielding film 121 is formed on the surface of the interlayer insulating film 120 except for a portion immediately above the photodiode 119 to manufacture a solid-state imaging device 110.

In the device step, for example, a heat treatment is generally performed at a temperature in the range of 600° C. to 1000° C. during, for example, a gate oxide film forming process, an element separation process, and a polysilicon gate electrode forming process. The heat treatment makes it possible to deposit the oxygen precipitate 17, and the oxygen precipitate can act as a gettering sink in the subsequent step. The gettering sink makes it possible for heavy metal not to be segregated on the n+ epitaxial layer 12A, serving as a phosphorus getter. Therefore, it is possible to prevent deterioration of device characteristics.

Figure 3:
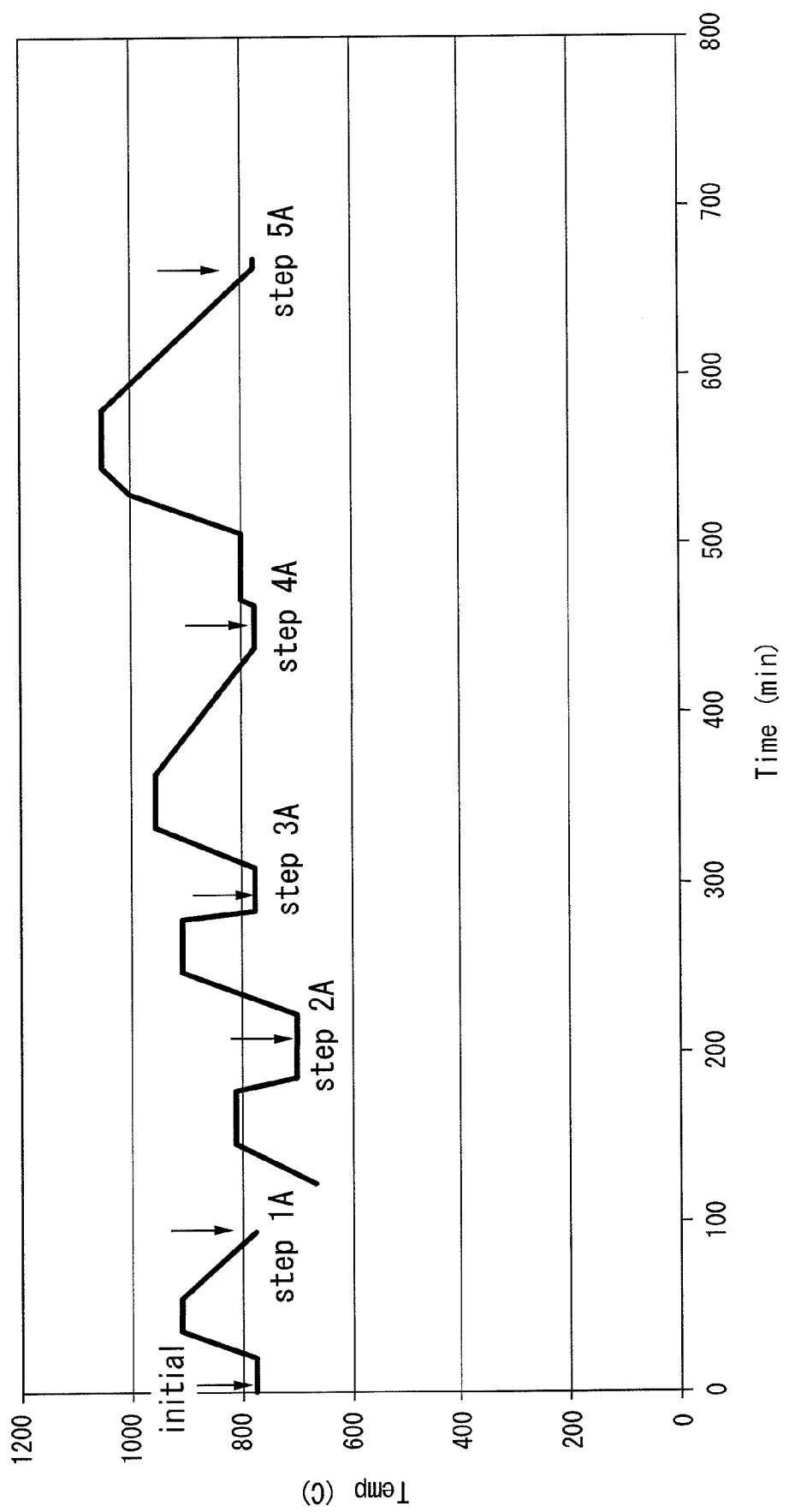
FIG. 3 is a diagram illustrating a heat treatment in an example using the first silicon substrate according to the embodiment of the present invention.

The heat treatment conditions of the device step correspond to the conditions shown in FIG. 3.

Specifically, Initial, Step 1A, Step 2A, Step 3A, Step 4A, and Step 5A shown in FIG. 3 correspond to the end times of steps of a process of forming a photodiode and a transmission transistor for the silicon substrate 13 having the epitaxial layer 12A and the epitaxial layer 12B formed thereon.

When the above-mentioned heat treatment is performed separately from the device step, it is preferable that the heat treatment be performed at a temperature greater than or equal to 600° C. and less than or equal to 800° C. for greater than or equal to 0.25 hours and less than or equal to 3 hours in a mixed atmosphere of oxygen and an inert gas, such as argon or nitrogen. The heat treatment makes it possible to give an IG (gettering) effect to the silicon substrate.

If the heat treatment for giving the IG effect is performed at a temperature less than the above-mentioned temperature range regardless of when the device step is performed, a complex of boron, carbon, and oxygen is insufficiently formed. When metal contamination occurs in the substrate, it is difficult to obtain sufficient gettering capability, which is not preferable. On the other hand, if the heat treatment is performed at a temperature that is greater than the above-mentioned temperature range, an excessively large amount of oxygen precipitate is agglutinated. As a result, the density of the gettering sinks is insufficient, which is not preferable.

The temperature and the process time of the heat treatment may be changed as long as the same precipitation effect (for example, the effect of obtaining an oxygen precipitate) as that under the conditions of a temperature of 600° C. and a process time of 30 minutes can be obtained. The temperature and the process time of the heat treatment may be changed as long as the same precipitation effect (for example, the effect of obtaining an oxygen precipitate) as that under the conditions of a temperature of 800° C. and a process time of 4 hours can be obtained.

Next, the pulling of a carbon-added CZ single crystal silicon will be described. A wafer having a diameter of 300 mm will be described, but the present invention is not limited thereto.

Figure 4:
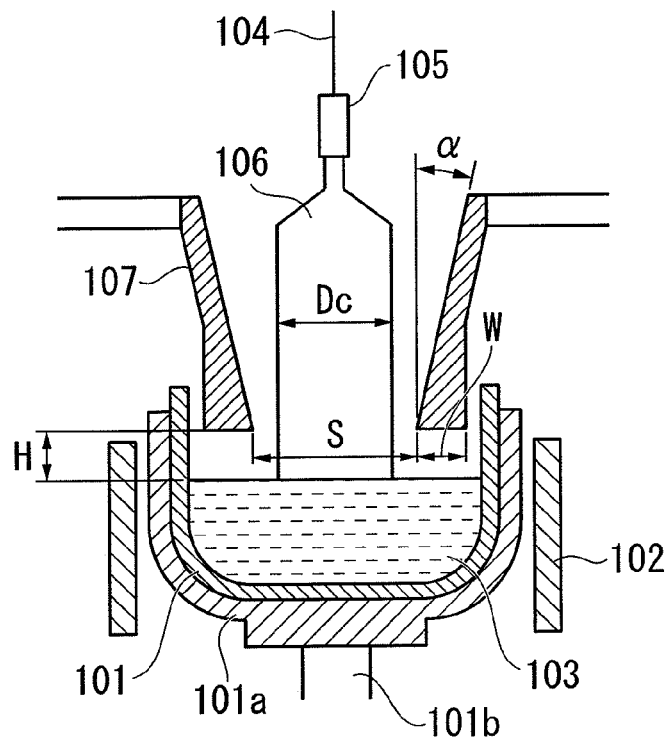
FIG. 4 is a longitudinal cross-sectional view illustrating a CZ pulling furnace used to manufacture a single crystal silicon used for the first silicon substrate.

FIG. 4 is a longitudinal cross-sectional view illustrating a CZ furnace suitable to describe a method of producing a single crystal silicon according to this embodiment. The CZ furnace includes a crucible (vitreous silica crucible) 101 that is arranged at the center in a chamber and a heater 102 that is arranged outside the crucible 101. The crucible 101 has a double structure in which an outer graphite crucible 101a holds an inner vitreous silica crucible 101 having a raw material melt 103 contained therein, and is rotated and moved up and down by a supporting shaft 101b called a pedestal. A cylindrical thermal shield 107 is provided above the crucible 101.

The outer shell of the thermal shield 107 is made of graphite, and the thermal shield has graphite felt filled therein. The thermal shield 107 has a tapered inner surface having a diameter that is gradually reduced from the upper end to the lower end. The upper outer surface of the thermal shield 107 has a tapered shape corresponding to the tapered inner surface, and the lower outer surface thereof is substantially straight such that the thickness of the thermal shield 107 is gradually increased downward.

The CZ furnace can grow a 300-mm single crystal having a target diameter Dc of, for example, 310 mm and a body length of, for example, 1200 mm.

The thermal shield 107 has the following dimensions. The outside diameter of a portion that is placed in the crucible is, for example, 570 mm, the minimum inside diameter S of the lowermost portion is, for example, 370 mm, and the width W of the thermal shield in the radial direction is, example, 100 mm. In addition, the inclination angle α of the inner surface of an inverted truncated cone in the vertical direction is, for example, 21°, the outside diameter of the crucible 101 is, for example, 650 mm, and a height H from a melt surface of the lower end of the thermal shield 107 is, for example, 60 mm.

Next, a method of setting operation conditions for growing the carbon-added CZ single crystal silicon will be described.

First, for example, 250 kilograms (kg) of high-purity polycrystal silicon is put into the crucible, and an n type dopant (phosphorus (P)) is added at a concentration that allows the resistivity of the single crystal silicon to correspond to an n type.

In this embodiment, a dopant is added to a silicon melt such that carbon concentration is in the above-mentioned range. For example, graphite power is used as the dopant.

Further, for example, the crystal rotation speed, the crucible rotation speed, heating conditions, and magnetic field conditions are controlled to obtain the above-mentioned oxygen concentration.

The internal pressure of the furnace is set to be greater than or equal to 1.33 kPa and less than or equal to 26.7 kPa (greater than or equal to 10 torr and less than or equal to 200 torr), which is a reduced pressure range, in an inert gas atmosphere. In addition, 3 percent by volume (vol %) or more and 20 vol % or less of hydrogen gas is mixed with an inert gas (for example, Ar gas) and the mixed gas is introduced into the furnace. The pressure is preferably greater than or equal to 1.33 kPa (10 torr), more preferably greater than or equal to 4 kPa and less than or equal to 26.7 kPa (greater than or equal to 30 torr and less than or equal to 200 torr), and most preferably greater than or equal to 4 kPa and less than or equal to 9.3 kPa (greater than or equal to 30 torr and less than or equal to 70 torr).

When the partial pressure of hydrogen is lowered, the concentration of hydrogen in the melt and crystal is lowered. Therefore, the lower limit of the pressure is defined in order to prevent the lowering of the hydrogen concentration. When the internal pressure of the furnace is increased, the gas flow rate on the melt of an inert gas, such as Ar, is lowered. Then, a reactant gas, such as carbon degassed from a carbon heater or a carbon member or SiO evaporated from a melt, is not easily exhausted, and the concentration of carbon in crystal is greater than a desired value. In addition, SiO is agglutinated on an inner portion of the furnace that is above the melt and has a temperature of about 1100° C. or less, and dust is generated and falls into the melt. As a result, crystal dislocation occurs. Therefore, the upper limit of the pressure is defined in order to prevent crystal dislocation.

Then, silicon is heated and melted by the heater 102 to obtain a melt 103. Then, a seed crystal held by a seed chuck 105 is immersed in the melt 103, and the crucible 101 and a pulling shaft 104 are rotated to pull a crystal. Any one of the {100}, {111}, and {110}-oriented crystals is used, and seed-narrowing is performed to remove crystal dislocation. Then, a shoulder portion is formed, and the shoulder portion is changed to obtain a target body diameter of, for example, 310 mm.

Thereafter, a body portion having a diameter of, for example, 1200 mm is grown at a constant pulling speed, and the body portion is compressed under normal conditions. Then, tail narrowing is performed, and the crystal growth operation is completed. In this case, the pulling speed is appropriately determined depending on, for example, resistivity, the diameter of a single crystal silicon, and the hot zone structure (thermal environment) of the single crystal pulling apparatus used. For example, qualitatively, a pulling speed including the range in which an OSF ring is generated in a single crystal plane can be used. The lower limit of the pulling speed may be greater than or equal to the pulling speed that generates the OSF ring region in the single crystal plane but does not generate a dislocation cluster.

The concentration of hydrogen in the inert atmosphere may be greater than or equal to 3% and less than or equal to 20% with respect to the internal pressure of the furnace that is greater than or equal to 4.0 kPa and less than or equal to 9.33 kPa (greater than or equal to 30 torr and less than or equal to 70 torr). The internal pressure of the furnace is preferably greater than or equal to 1.33 kPa (10 torr), more preferably greater than or equal to 4.0 kPa and less than or equal to 26.7 kPa (greater than or equal to 30 torr and less than or equal to 200 torr), and most preferably greater than or equal to 4.0 kPa and less than or equal to 9.3 kPa (greater than or equal to 30 torr and less than or equal to 70 torr).

When the partial pressure of hydrogen is lowered, the concentration of hydrogen in a melt and crystal is lowered. Therefore, the lower limit of the pressure is defined in order to prevent the lowering of the hydrogen concentration. When the internal pressure of the furnace is increased, the gas flow rate on the melt of an inert gas, such as Ar, is lowered. Then, a reactant gas, such as carbon degassed from a carbon heater or a carbon member or SiO evaporated from a melt, is not easily exhausted, and the concentration of carbon in crystal is greater than a desired value. In addition, SiO is agglutinated on an inner portion of the furnace that is above the melt and has a temperature of about 1100° C. or less, and dust is generated and falls into the melt. As a result, crystal dislocation occurs. Therefore, the upper limit of the pressure is defined in order to prevent crystal dislocation. It is preferable that the partial pressure of hydrogen be greater than or equal to 40 Pa and less than or equal to 400 Pa.

When silicon growth is performed in an inert atmosphere including hydrogen, the concentration of hydrogen in the single crystal silicon can be controlled by the partial pressure of hydrogen in the atmosphere. When hydrogen is introduced into a crystal, hydrogen in the atmosphere is dissolved in a silicon melt and becomes a normal (equilibrium) state. In addition, in order to introduce hydrogen to a crystal, hydrogen concentrations in a liquid phase and a solid phase are distributed by concentration segmentation during congelation.

The concentration of hydrogen in a melt is determined depending on the partial pressure of hydrogen in a gas phase by Henry's law. The concentration of hydrogen in the crystal immediately after congelation can be controlled to a desired constant value in the axial direction of the crystal by controlling the partial pressure of hydrogen in the atmosphere.

According to the single crystal silicon growing method, since a single crystal silicon is pulled in an inert atmosphere including hydrogen, COP and a dislocation cluster are not included in the entire region of a crystal in the diametric direction. In addition, since the single crystal silicon is pulled while widening the range of a PI region pulling speed capable of pulling a single crystal in an interstitial silicon-dominated region (PI region), a straight portion of the single crystal can become the interstitial silicon-dominated region (PI region) without a dislocation cluster. In addition, the width of the OSF ring is reduced. In the related art, when a grown-in defect-free single crystal is pulled, the PI region pulling speed needs to be set in a very narrow range. However, in this embodiment, it is possible to very easily grow a grown-in defect-free single crystal at a pulling speed that is greater than that of the related art. In addition, when a single crystal silicon is pulled when an OSF ring region is generated in the crystal plane, it is possible to decrease the width of the OSF ring and reduce the influence of the OSF ring.

In this embodiment, the PI region pulling speed range in a hydrogen atmosphere is compared with that in an inert atmosphere without hydrogen when the value of a temperature gradient G in the axial direction of a crystal immediately after congelation does not vary.

Figure 5:
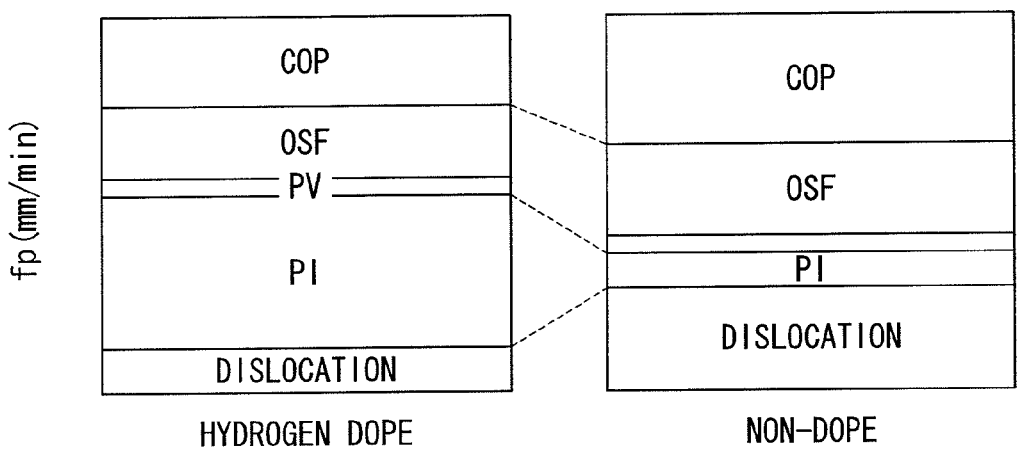
FIG. 5 is a diagram schematically illustrating a variation in pulling speed range due to the addition of hydrogen when the single crystal silicon used for the first silicon substrate is manufactured.

Specifically, in the hydrogen atmosphere, the PI region pulling speed range capable of pulling a grown-in defect-free single crystal that is composed of an interstitial-silicon-type grown-in defect-free region (PI region) is four times or more than that in the atmosphere without hydrogen. For example, as shown in FIG. 5, in the hydrogen atmosphere (hydrogen is doped), the pulling speed has a margin that is 4.5 times that in the atmosphere without hydrogen (non-doped). Therefore, the above-mentioned pulling speed range makes it possible to pull a desired single crystal in the hydrogen atmosphere.

In this case, it is possible to reduce the region in which the OSF ring is generated. In addition, the size of a PV region (vacancy-type grown-in defect-free region) does not vary by the addition of hydrogen.

In this embodiment, as described above, the addition of hydrogen makes it easy to pull a grown-in defect-free single crystal, and the addition of carbon makes it possible to reduce the influence of the OSF ring. Therefore, when an epitaxial layer is grown on the wafer, defects caused by the OSF ring can be reduced and a single crystal having a desired quality can be pulled by the synergistic effect of the addition of hydrogen and the addition of carbon. As a result, operating efficiency is improved, and it is possible to significantly reduce the manufacturing cost of a single crystal silicon or a silicon substrate manufactured from the single crystal silicon.

The method of manufacturing the first silicon substrate according to the first embodiment includes the steps of: pulling a single crystal silicon having an n type dopant concentration corresponding to a resistivity that is greater than or equal to $8 \times 10^{-3}$ $\Omega$cm and less than or equal to $10 \times 10^{-3}$ $\Omega$cm, a carbon (C) concentration that is greater than or equal to $0.5 \times 10^{16}$ atoms/cm$^3$ and less than or equal to $1.6 \times 10^{17}$ atoms/cm$^3$, and an oxygen concentration that is greater than or equal to $1.4 \times 10^{18}$ atoms/cm$^3$ and less than or equal to $1.6 \times 10^{18}$ atoms/cm$^3$ using a CZ method; and slicing the pulled single crystal silicon into a silicon substrate and performing a heat treatment on the silicon substrate to form an oxygen precipitate.

It is more preferable that the C concentration (carbon concentration) be greater than or equal to $1.0 \times 10^{16}$ atoms/cm$^3$ and less than or equal to $1.0 \times 10^{17}$ atoms/cm$^3$ and initial oxygen concentration be greater than or equal to $1.4 \times 10^{18}$ atoms/cm$^3$ and less than or equal to $1.6 \times 10^{18}$ atoms/cm.

The heat treatment for forming the oxygen precipitate may be performed at a temperature greater than or equal to 600° C. and less than or equal to 800° C. for a process time that is greater than or equal to 0.25 hours and less than or equal to 3 hours in a mixed atmosphere of oxygen and an inert gas, such as argon or nitrogen.

In addition, in this embodiment of the present invention, the method of manufacturing a silicon substrate further includes a step of forming a silicon epitaxial layer having an n type dopant concentration corresponding to a resistivity that is greater than or equal to 0.1 $\Omega$cm and less than or equal to 100 $\Omega$cm on the sliced silicon substrate, before a heat treatment for forming an oxygen precipitate is performed.

Further, in this embodiment of the present invention, when the single crystal silicon is grown, hydrogen may be added to an inert gas atmosphere. In this case, in the single crystal silicon pulling step, the pressure of the inert gas atmosphere having hydrogen added thereto may be greater than or equal to 1.33 kPa and less than or equal to 26.7 kPa, which is a reduced pressure range, and the concentration of hydrogen gas in the atmosphere may be greater than or equal to 3 vol % and less than or equal to 20 vol %.

In addition, this embodiment of the present invention provides a first silicon substrate manufactured by the above-mentioned manufacturing method. Among BMDs serving as intrinsic gettering sinks, the density of the BMDs having a size greater than or equal to 10 nm and less than or equal to 100 nm is greater than or equal to $1.0 \times 10^6$ BMDs/cm$^3$ and less than or equal to $1.0 \times 10^{11}$ BMDs/cm$^3$.

Further, this embodiment may provide a silicon substrate for a solid-state imaging device. The silicon substrate includes a gettering layer that is provided immediately below a buried photodiode of the solid-state imaging device and has a BMD density that is greater than or equal to $1.0 \times 10^6$ BMDs/cm$^3$ and less than or equal to $1.0 \times 10^{11}$ BMDs/cm$^3$. In this case, the BMDs have a size greater than or equal to 10 nm and less than or equal to 100 nm. A silicon epitaxial layer having an n type dopant concentration corresponding to a resistivity that is greater than or equal to 0.1 $\Omega$cm and less than or equal to 100 $\Omega$cm is formed immediately on the silicon substrate manufactured by the above-mentioned manufacturing method. In addition, the gettering layer may be provided immediately below the epitaxial layer.

The inventors examined a technique capable of preventing heavy metal contamination in a silicon substrate.

First, the present inventions examined a gettering method using carbon ion implantation. The examination results provided that a gettering effect by carbon implantation was generally obtained from an oxide precipitated due to the distortion (strain) of a silicon lattice caused by ion implantation with high energy; and since the strain of the lattice was concentrated on an ion-implanted narrow region and strain was likely to occur around an oxide during a high-temperature heat treatment in the device step, a gettering effect was insufficient particularly in the heat treatment of the device step.

The inventors examined in detail the operation of carbon contributing to the formation of gettering sinks in the silicon substrate. As a result of the examination, carbon was dissolved in the silicon lattice so as to be substituted for silicon, without forcibly introducing carbon by ion implantation. The examination results proved that, in this method, a carbon/oxygen-based precipitate involving dislocation could be formed at the substitution position with high density in, for example, the device step and a high gettering effect was obtained by the carbon/oxygen-based precipitate. In addition, the examination results proved that the substitution was caused by carbon or oxygen dissolved in a single crystal silicon.

The inventors analyzed and examined the states and actions of carbon, oxygen, and boron. The examination results proved that, when a single crystal silicon was pulled under the conditions of an n type dopant concentration corresponding to a resistivity greater than or equal to $8 \times 10^{-3}$ $\Omega$cm and less than or equal to $10 \times 10^{-3}$ $\Omega$cm, a carbon concentration greater than or equal to $0.5 \times 10^{16}$ atoms/cm$^3$ and less than or equal to $1.6 \times 10^{17}$ atoms/cm$^3$, and an oxygen concentration greater than or equal to $1.4 \times 10^{18}$ atoms/cm$^3$ and less than or equal to $1.6 \times 10^{18}$ atoms/cm$^3$, thereby obtaining a wafer. An epitaxial layer was formed on the wafer, and heat treatment was performed at a temperature greater than or equal to 600° C. and less than or equal to 800° C., it was possible to form a silicon substrate having sufficient BMD size and density to form gettering sinks required to getter heavy metal and sufficient gettering capability.

Further, in this embodiment of the present invention, when the concentration of carbon added to an n type dopant-added silicon crystal is greater than or equal to $0.5 \times 10^{16}$ atoms/cm$^3$ and less than or equal to $1.610 \times 10^{17}$ atoms/cm$^3$, gettering sinks having carbon and oxygen as nuclei are formed during a crystal growth process. Even when a high-temperature heat treatment is performed, these gettering sinks stably exist. Therefore, these gettering sinks exist even after epitaxial growth. Thus, oxide precipitates act as precipitate nuclei immediately after epitaxial growth, and the nuclei are grown during a heat treatment of the device step and serve as gettering sinks for heavy metal contamination during the heat treatment of the device step.

The first silicon substrate according to this embodiment of the present invention is suitable to be used for a silicon substrate for a solid-state imaging device. The first silicon substrate can be applicable for any substrate requiring high gettering capability.

For example, the first silicon substrate according to this embodiment of the present invention can be used as a wafer for a multi chip package (MCP), such as NAND-FLASH or NOR-FLASH. In this case, since the device structure is CMOS, it is also possible to maintain high gettering capability in the following concentration ranges: an n type dopant concentration corresponding to a resistivity that is greater than or equal to $8 \times 10^{-3}$ Ωcm and less than or equal to $10 \times 10^{-3}$ Ωcm; a carbon concentration that is greater than or equal to $0.5 \times 10^{16}$ atoms/cm$^3$ and less than or equal to $1.6 \times 10^{17}$ atoms/cm$^3$; and an oxygen concentration that is greater than or equal to $1.4 \times 10^{18}$ atoms/cm$^3$ and less than or equal to $1.6 \times 10^{18}$ atoms/cm$^3$.

Furthermore, the first silicon substrate for a solid-state imaging device according to this embodiment includes a gettering layer that is formed immediately below a buried photodiode of the solid-state imaging device and has high gettering efficiency of heavy metal. This embodiment also provides a method of manufacturing a first silicon substrate for a solid-state imaging device. The method includes the steps of: forming a silicon substrate with a carbon-added CZ crystal; forming a silicon epitaxial layer on the silicon substrate; and forming gettering sinks immediately below the epitaxial layer.

In this embodiment, carbon is added to a CZ crystal, the gettering sinks are formed immediately below the epitaxial layer using a solid-state imaging device manufacturing process (heat treatment process), and heavy metal contamination is removed in the device step. Therefore, it is possible to improve the quality of a solid-state imaging device, such as electrical characteristics.

This embodiment also provides a first silicon substrate for a solid-state imaging device that includes a gettering layer formed immediately below a buried photodiode of the solid-state imaging device. In this way, it is possible to improve the gettering efficiency of heavy metal. In addition, this embodiment also provides a method of manufacturing a first silicon substrate for a solid-state imaging device. The method includes the step of: forming gettering sinks made of carbon and oxygen in a substrate made of a CZ crystal having a carbon concentration that is greater than or equal to $0.5 \times 10^{16}$ atoms/cm$^3$ and less than or equal to $1.6 \times 10^{17}$ atoms/cm$^3$ and an n type dopant concentration corresponding to a resistivity that is less than or equal to $10 \times 10^{-3}$ Ωcm.

Furthermore, in this embodiment, in a solid-state imaging device manufacturing step, a minute oxygen precipitate having secondary dislocation is formed with high density immediately below the epitaxial layer. The oxygen precipitate makes it possible to maintain sufficient gettering capability even in a low-temperature heat treatment process.

The first silicon substrate according to this embodiment is a silicon substrate for a solid-state imaging device that includes a gettering layer formed immediately below a buried photodiode of the solid-state imaging device and has high gettering efficiency of heavy metal. The silicon substrate is made of a CZ crystal having carbon added thereto. A method of manufacturing a first silicon substrate for a solid-state imaging device according to this embodiment includes the step of forming gettering sinks in a silicon substrate having a carbon concentration that is greater than or equal to $0.5 \times 10^{16}$ atoms/cm$^3$ and less than or equal to $1.6 \times 10^{17}$ atoms/cm$^3$ and an oxygen concentration that is greater than or equal to $1.4 \times 10^{18}$ atoms/cm$^3$ and less than or equal to $1.6 \times 10^{18}$ atoms/cm$^3$.

In this embodiment, in particular, when a heat treatment process is performed at a temperature that is greater than or equal to 600° C. and less than or equal to 700° C., it is possible to form a high-density oxygen precipitate immediately below the epitaxial layer and obtain high gettering capability. Therefore, when the substrate is used to manufacture a solid-state imaging device, it is possible to improve electrical characteristics of the solid-state imaging device. As a result, it is possible to improve the yield of a solid-state imaging device.

In the silicon substrate for a solid-state imaging device according to this embodiment of the present invention, carbon is added to a CZ crystal or an MCZ crystal having predetermined n type dopant concentration and oxygen concentration. Therefore, it is possible to form a carbon/oxygen precipitate having high gettering capability in the silicon substrate made of a single crystal by setting predetermined heat treatment conditions in a heat treatment process of a manufacturing step of mounting a device on the silicon substrate.

Therefore, it is possible to form gettering sinks over the entire thickness of the silicon substrate from immediately below the buried photodiode. In particular, during the device step, the diffusion of heavy metal to the device rather than to the n+ epitaxial layer is prevented, and the occurrence of defects in the device is prevented. As a result, it is possible to provide a high-quality solid-state imaging device with high electrical characteristics at a low cost.

Second Embodiment

Hereinafter, a silicon substrate according to a second embodiment of the present invention will be described with reference to the accompanying drawings.

The second embodiment of the present invention relates to a second silicon substrate and a method of manufacturing the same, and more particularly, to a technique applicable for a silicon substrate for a solid-state imaging device that can improve gettering capability regardless of a heat treatment of a device step and is used to manufacture a solid-state imaging device.

FIGS. 7A to 7D are front cross-sectional views illustrating a silicon substrate in each step of a method of manufacturing a silicon substrate according to this embodiment, and FIG. 13 is a flowchart illustrating the method of manufacturing a silicon substrate according to this embodiment. In the drawings, reference numeral 21 denotes a silicon substrate.

As shown in FIG. 13, the method of manufacturing a silicon substrate according to this embodiment includes a preparation step S1 of preparing a silicon substrate (silicon wafer) 21, a heat treatment step S2 of obtaining a gettering effect, an ion implantation step (implantation step) S3, a recovery heat treatment step S4, an epitaxial step S5, and a device step S6.

In the example shown in FIGS. 7A to 7D, first, the silicon substrate 21 is obtained in the preparation step S1 shown in FIG. 13. For example, first, polysilicon, which is a raw material of a silicon crystal, is placed in, for example, a vitreous silica crucible, and a predetermined amount of graphite powder is applied on the surface of the polysilicon. At the same time, phosphorus (P) is injected as a dopant, and a CZ crystal having carbon added thereto is pulled up in a hydrogen atmosphere by, for example, the Czochralski method (CZ method), which will be described below.

Figure 7A:
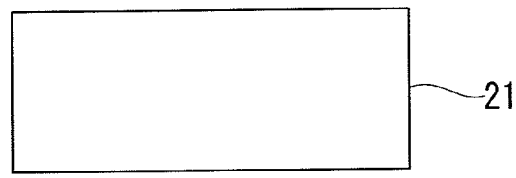
FIGS. 7A to 7D are front cross-sectional views illustrating a method of manufacturing a second silicon substrate according to another embodiment of the present invention.

In this embodiment, an n type single crystal silicon including an n type dopant, such as phosphorus, is manufactured as follows. Carbon is added to a raw material to make a carbon-added raw material, and a single crystal silicon is produced from the carbon-added raw material. Then, the oxygen concentration Oi of the single crystal silicon is controlled to pull the single crystal silicon. The silicon substrate 21 including carbon shown in FIG. 7A is obtained from the carbon-added CZ single crystal silicon.

A general method is performed to process the silicon substrate 21. That is, a cutting apparatus, such as an ID saw or a wire saw, is used to slice a single crystal silicon to obtain a silicon wafer. Then, annealing is performed on the obtained silicon wafer, and then surface treatments, such as polishing and cleaning, are performed on the silicon wafer. In addition to these processes, there are various processes, such as wrapping, cleaning, and grinding. The order of the processes may be changed, and the processes may be appropriately omitted for the purpose of use.

The obtained silicon substrate 21 has a phosphorus (P) concentration corresponding to an n type. Carbon concentration is greater than or equal to $1.0 \times 10^{16}$ atoms/cm$^3$ and less than or equal to $1.6 \times 10^{17}$ atoms/cm$^3$. Oxygen concentration is greater than or equal to $1.4 \times 10^{18}$ atoms/cm$^3$ and less than or equal to $1.6 \times 10^{18}$ atoms/cm$^3$.

Since carbon in a solid solution state is included in silicon, carbon is introduced into a silicon lattice so as to be substituted for silicon. That is, the radius of a carbon atom is smaller than that of a silicon atom. Therefore, when carbon is disposed at a substitution position, the stress field of a crystal becomes a compression stress field, and interstitial oxygen and impurities are likely to be gettered in the compression stress field. For example, in the device step, a high-density oxygen precipitate involving dislocation is likely to be generated from carbon at the substitution position, and it is possible to give a high gettering effect to the silicon substrate 21.

It is necessary to regulate the concentration of carbon added in the above-mentioned range. The reason is that, if the carbon concentration is less than the above-mentioned range, the formation of an oxygen/carbon-based precipitate is not accelerated and the above-mentioned high-density oxygen/carbon-based precipitate is not formed.

On the other hand, if the carbon concentration is greater than the above-mentioned range, the formation of an oxygen/carbon-based precipitate is accelerated, and a high-density oxygen/carbon-based precipitate is obtained. When the size of the precipitate is regulated, strain around the precipitate tends to be reduced. Therefore, the effect of strain is reduced, and the effect of gettering impurities is reduced.

Furthermore, it is necessary to regulate the oxygen concentration in the silicon substrate 21 in the above-mentioned range. The reason is that, if the oxygen concentration is less than the above-mentioned range, the formation of a carbon/oxygen-based precipitate is not accelerated and the above-mentioned high-density precipitate is not obtained.

On the other hand, if the oxygen concentration is greater than the above-mentioned range, the size of an oxygen precipitate is decreased, and the effect of strain in an interface between a maternal silicon atom and a precipitate is reduced. As a result, a gettering effect due to strain is reduced.

The carbon concentration and the oxygen concentration make it possible to accelerate the formation of a composite defect of carbon and oxygen in an n type silicon substrate including an oxygen precipitate lightly doped with phosphorus, as compared to a p type silicon substrate doped with, for example, boron (B). As a result, it is possible to obtain sufficient gettering capability.

As the heat treatment step S2 for obtaining a gettering effect shown in FIG. 13, a heat treatment is performed on the silicon substrate 21, which is a carbon-added CZ crystal, at a temperature greater than or equal to 600° C. and less than or equal to 800° C. for a time that is greater than or equal to 0.25 hours and less than or equal to 4 hours in a mixed atmosphere of oxygen and an inert gas, such as argon or nitrogen, thereby depositing an oxygen precipitate 27 on the silicon substrate 21. The heat treatment for obtaining a gettering effect is performed under the above-mentioned conditions to deposit the oxygen precipitate 27 which is the carbon/oxygen-based precipitate from carbon at a substitution position.

In this way, it is possible to form gettering sinks having high gettering capability for metal contamination over the entire thickness of the silicon substrate 21, using a second silicon substrate 23 including solute carbon as a base material. As a result, gettering is performed near the surface of the silicon substrate 21.

In the present invention, the carbon/oxygen-based precipitate means a complex (cluster) including at least carbon.

In order to achieve the gettering, it is preferable that the oxygen precipitate 27, which is a carbon/oxygen-based complex, have a size greater than or equal to 10 nm and less than or equal to 100 nm and a density greater than or equal to $1.0 \times 10^6$ BMDs/cm$^3$ and less than or equal to $1.0 \times 10^{11}$ BMDs/cm$^3$.

If the size of the oxygen precipitate 27 is greater than or equal to the lower limit of the above-mentioned range, it is possible to increase the probability of gettering interstitial impurities (for example, heavy metal) using the effect of strain occurring in an interface between a maternal silicon atom and the oxygen precipitate. On the other hand, if the size of the oxygen precipitate 27 is greater than or equal to the above-mentioned range, the strength of the substrate is lowered or dislocation occurs in the epitaxial layer, which is not preferable.

It is preferable that the density of the oxygen precipitate 27 in the silicon substrate be in the above-mentioned range since the gettering of heavy metal in the silicon crystal depends on strain occurring in the interface between the maternal silicon atom and the oxygen precipitate and an interface level density (volume density).

If the heat treatment step S2 for obtaining the IG effect is performed at a temperature less than the above-mentioned temperature range, a complex of carbon and oxygen is insufficiently formed regardless of the order of other steps. When metal contamination occurs in the substrate, it is difficult to obtain sufficient gettering capability, which is not preferable. On the other hand, if the heat treatment is performed at a temperature that is greater than the above-mentioned temperature range, an excessively large amount of oxygen precipitate is agglutinated. As a result, the density of the gettering sinks is insufficient, which is not preferable.

The temperature and the process time of the heat treatment may be changed as long as the same precipitation effect (for example, the effect of obtaining an oxygen precipitate) as that under the conditions of a temperature of 600° C. and a process time of 30 minutes can be obtained. The temperature and the process time of the heat treatment may be changed as long as the same precipitation effect (for example, the effect of obtaining an oxygen precipitate) as that under the conditions of a temperature of 800° C. and a process time of 4 hours can be obtained.

In this embodiment, after the preparation step S1 ends (before the heat treatment step S2 for obtaining a gettering effect), the silicon substrate 21 is a CZ crystal including a dopant and solute carbon. An oxygen precipitate nucleus or an oxygen precipitate formed in the CZ crystal during crystal growth is shrunken by a heat treatment when epitaxial growth is performed. Therefore, the oxygen precipitate formed in the silicon substrate 21 is not observed by an optical microscope.

The heat treatment step S2 for obtaining a gettering effect makes it possible to ensure gettering sinks for gettering heavy metal and to give the IG (gettering) effect to a silicon substrate.

Figure 7B:
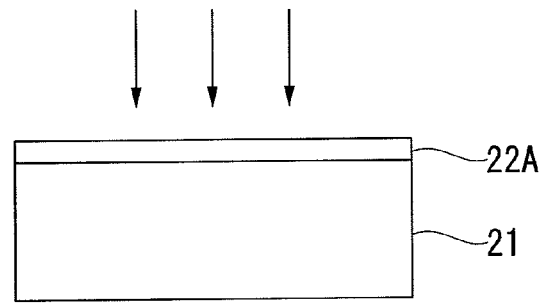

Then, in the ion implantation step (implantation step) S3 shown in FIG. 13, the silicon substrate 21 is put into an ion implantation furnace, and n type dopant ions are implanted into the surface of the silicon substrate 21 by ion implantation to form an n+ implantation layer 22A on the entire surface of the silicon substrate, as shown in FIG. 7B.

In this case, it is preferable that the thickness of the n+ implantation layer 22A be greater than or equal to 0.2 μm and less than or equal to 0.6 μm in terms of the spectral sensitivity characteristics of a solid-state imaging device. In addition, in the n+ implantation layer 22A, the concentration of phosphorus, which is a dopant, is set such that a conduction type is an n+ type.

In the case, for example, ion implantation is preferably performed under the following ion implantation conditions: an implantation ion: $P^+$; implantation energy; 100 to 150 keV; an implantation dose; $4 \times 10^{17}$ cm$^2$ to $1 \times 10^{17}$ cm$^2$; and a substrate temperature; 400° C. to 600° C.

Figure 12:
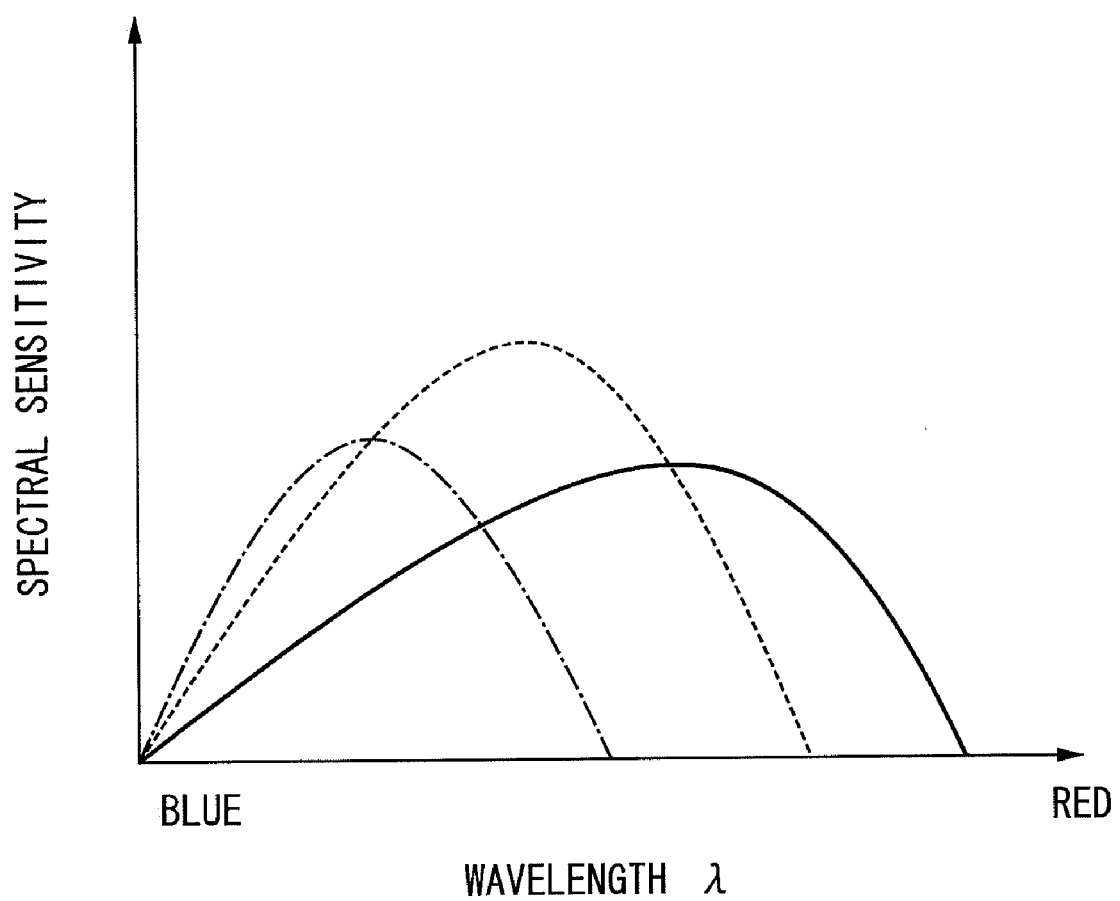
FIG. 12 is a diagram illustrating spectral characteristics of a solid-state imaging device obtained by the second silicon substrate.

In this embodiment, the thickness of the n+ implantation layer 22A is determined by the spectral sensitivity characteristics of a solid-state imaging device. As shown in FIG. 12, it is preferable that the spectral sensitivity characteristics of the solid-state imaging device correspond to when the peak of the wavelength detected by the solid-state imaging device has short wavelength characteristics represented by a one-dot chain line, when the peak of the wavelength detected by the solid-state imaging device corresponds to visible light represented by a dashed line, and when the peak of the wavelength detected by the solid-state imaging device corresponds to an infrared ray represented by a solid line. The spectral sensitivity characteristics are set in the range from when the thickness of the n+ implantation layer is small to when the thickness of the n+ implantation layer is large. It is preferable that the thickness of the n+ implantation layer be in the above-mentioned range.

Then, in the recovery heat treatment step S4 shown in FIG. 13, an annealing process is performed. The annealing process is performed to cure the silicon substrate 21 damaged by ion implantation and recover the bonding state of a single crystal silicon and the surface state of the silicon substrate 21.

It is preferable that the annealing process be performed under the following conditions: a process temperature; 950 to 1200° C.; an Ar atmosphere; and a process time; 5 to 10 hours.

Figure 7C:
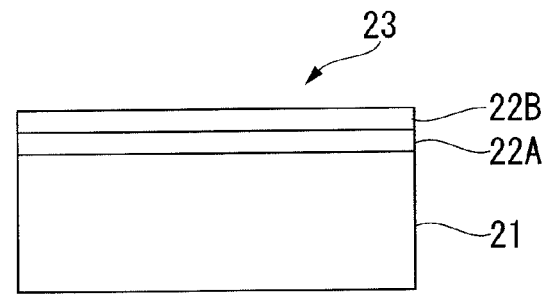

Then, in the epitaxial step S5 shown in FIG. 13, the silicon substrate 21 is put into an epitaxial growth furnace, and various CVD (chemical vapor deposition) methods are used to grow an n epitaxial layer 22B on the n+ implantation layer 22A to form the second silicon substrate 23, as shown in FIG. 7C.

In this embodiment, it is preferable that the thickness of the n epitaxial layer 22B be greater than or equal to 2 μm and less than or equal to 10 μm in terms of the spectral sensitivity characteristics of a solid-state imaging device.

In the epitaxial step S5, RCA cleaning, which is a combination of, for example, SC1 and SC2, is performed on the silicon substrate before an epitaxial layer is grown.

Figure 7D:
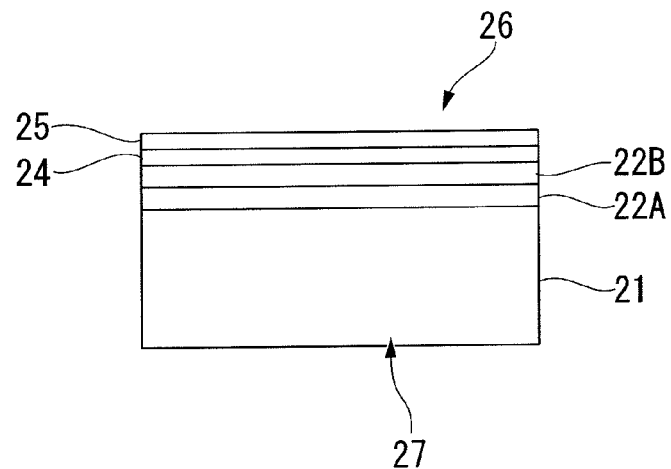

As shown in FIG. 7D, an oxide film 24 and a nitride film (polysilicon gate film) 25 are formed on the n epitaxial layer 22B of the n/n+/n type second silicon substrate 23 having the n+ implantation layer 22A and the n epitaxial layer 22B formed thereon, if necessary, and the silicon substrate is provided to the next device step. Then, in the device step, a buried photodiode is formed in the n epitaxial layer 22B to manufacture a solid-state imaging device 26.

It is preferable that the thicknesses of the oxide film 24 and the nitride film 25 be determined considering restrictions in the design of the driving voltage of a transmission transistor. Specifically, it is preferable that the thickness of the oxide film 24 be greater than or equal to 50 μm and less than or equal to 100 nm. In addition, it is preferable that the thickness of the nitride film 25, specifically, the thickness of the polysilicon gate film 25 of the solid-state imaging device be greater than or equal to 1.0 μm and less than or equal to 2.0 μm.

Then, in the device step S6 shown in FIG. 13, a device, such as a solid-state imaging device, is formed. In addition, a general solid-state imaging device manufacturing process may be used as the device step S6. A CCD manufacturing process is shown as an example of the device step in FIGS. 8A to 8F, but the present invention is not particularly limited to the device step shown in FIG. 13.

Figure 8A:
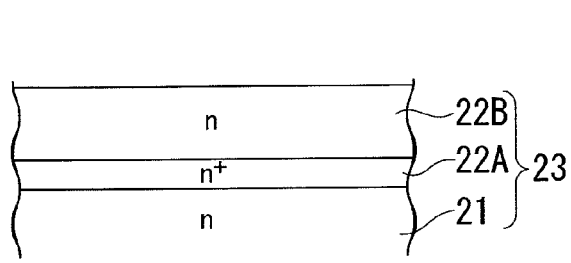
FIGS. 8A to 8F are front cross-sectional views illustrating a process of manufacturing a solid-state imaging device using the second silicon substrate.
Figure 8B:
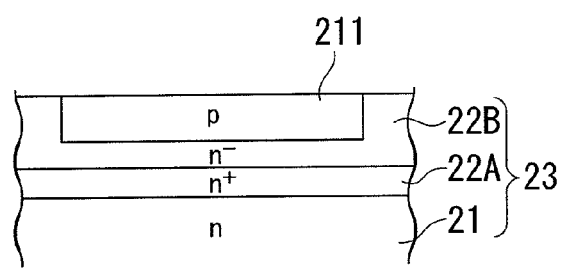
Figure 8C:
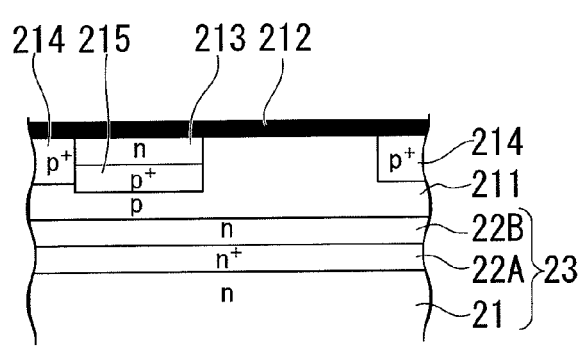

That is, in the device step S6, first, as shown in FIG. 8A, the second silicon substrate 23 having an n+ layer and an n layer (the n+ implantation layer 22A and the n epitaxial layer 22B) formed on the silicon substrate 21 shown in FIG. 7C is prepared. Then, as shown in FIG. 8B, a first p type well region 211 is formed at a predetermined position of the n epitaxial layer 22B. Then, as shown in FIG. 8C, a gate insulating film 212 is formed thereon, and n type and p type impurities are selectively implanted into the first p type well region 211 by ion implantation to form an n type transmission channel region 213, a p type channel stop region 214, and a second p type well region 215 forming a vertical transmission register.

Figure 8D:
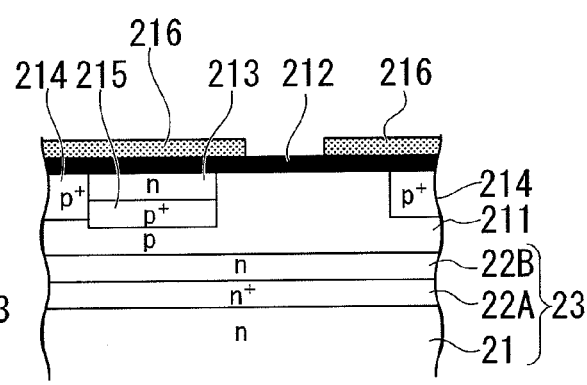
Figure 8E:
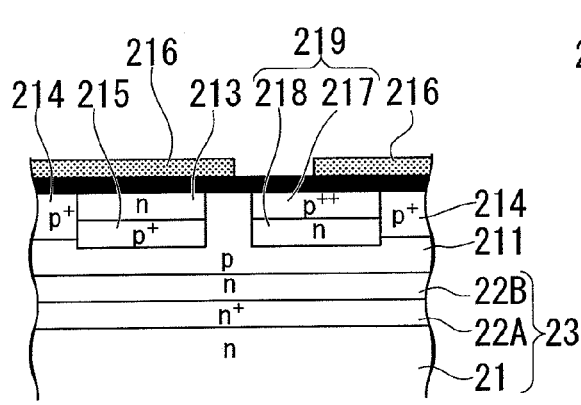

Then, as shown in FIG. 8D, transmission electrodes 216 are formed at predetermined positions on the surface of the gate insulating film 212. Then, as shown in FIG. 8E, n type and p type impurities are selectively implanted between the n type transmission channel region 213 and the second p type well region 215 to form a photodiode 219 having a laminated structure of a p type positive charge storage region 217 and an n type impurity diffusion region 218.

Figure 8F:
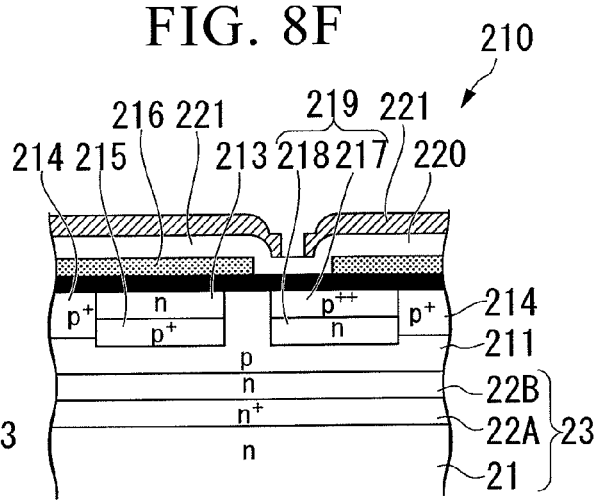

Then, as shown in FIG. 8F, an interlayer insulating film 220 is formed thereon, and a light-shielding film 221 is formed on the surface of the interlayer insulating film 220 except for a portion immediately above the photodiode 219 to manufacture a solid-state imaging device 210.

In the device step, for example, a heat treatment is generally performed at a temperature in the range of about 600° C. to 1000° C. during, for example, a gate oxide film forming process, an element separation process, and a polysilicon gate electrode forming process. The heat treatment makes it possible to deposit the oxygen precipitate 27, and the oxygen precipitate can act as gettering sinks in the subsequent step. The gettering sinks make it possible for heavy metal not to be segregated on the n+ implantation layer 22A, serving as a phosphorus getter. Therefore, it is possible to prevent deterioration of device characteristics.

Figure 9:
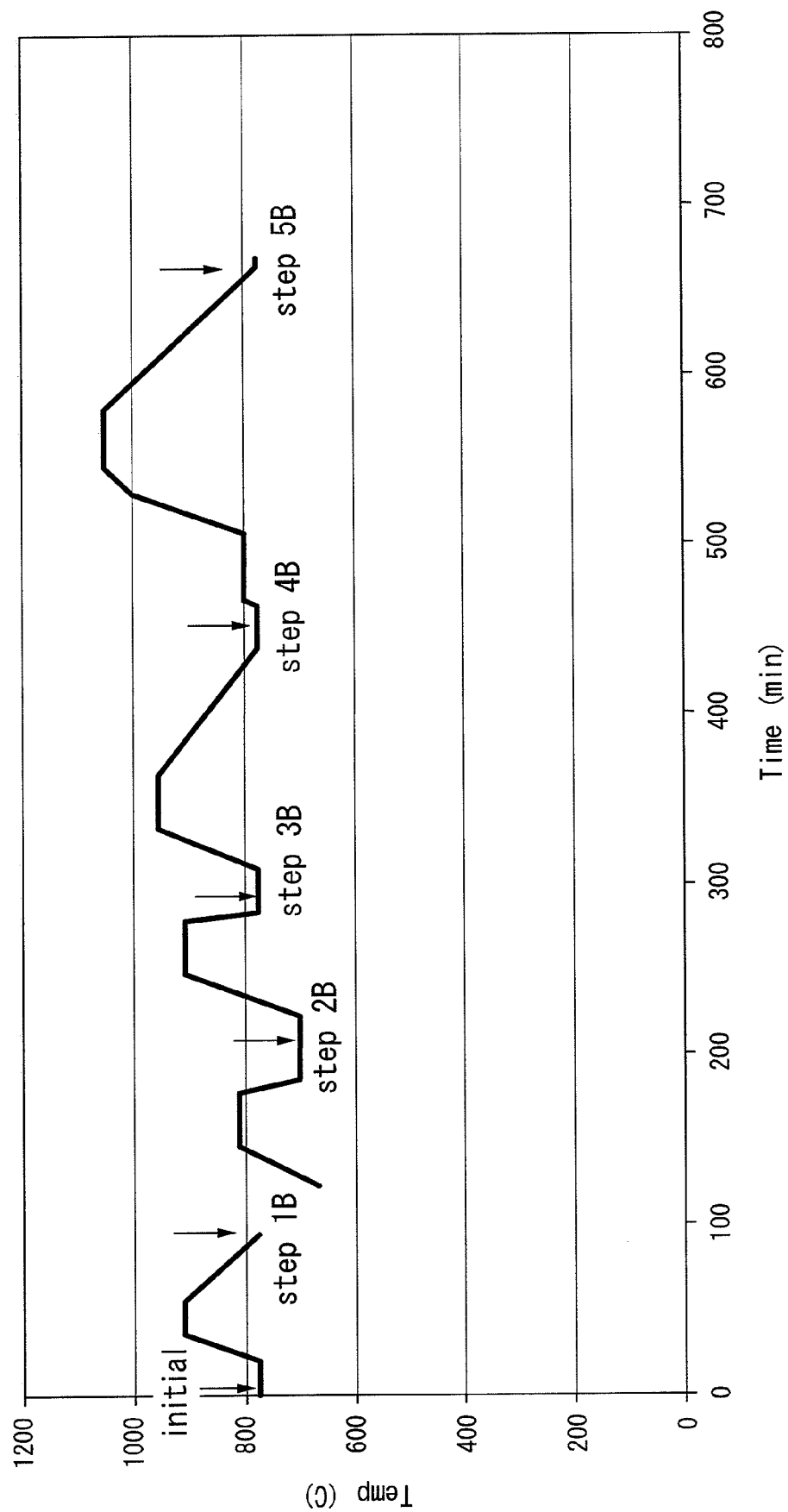
FIG. 9 is a diagram illustrating a heat treatment in an example using the second silicon substrate according to the embodiment of the present invention.

The heat treatment conditions of the device step correspond to the conditions shown in FIG. 9.

Specifically, Initial, Step 1B, Step 2B, Step 3B, Step 4B, and Step 5B shown in FIG. 9 correspond to the ending times of the steps of a process of forming a photodiode and a transmission transistor for the second silicon substrate 23 having the n+ implantation layer 22A A and the n epitaxial layer 22B formed thereon.

Next, the pulling of a carbon-added CZ single crystal silicon will be described. A wafer having a diameter of 300 mm will be described below, but this embodiment is not limited thereto.

Figure 10:
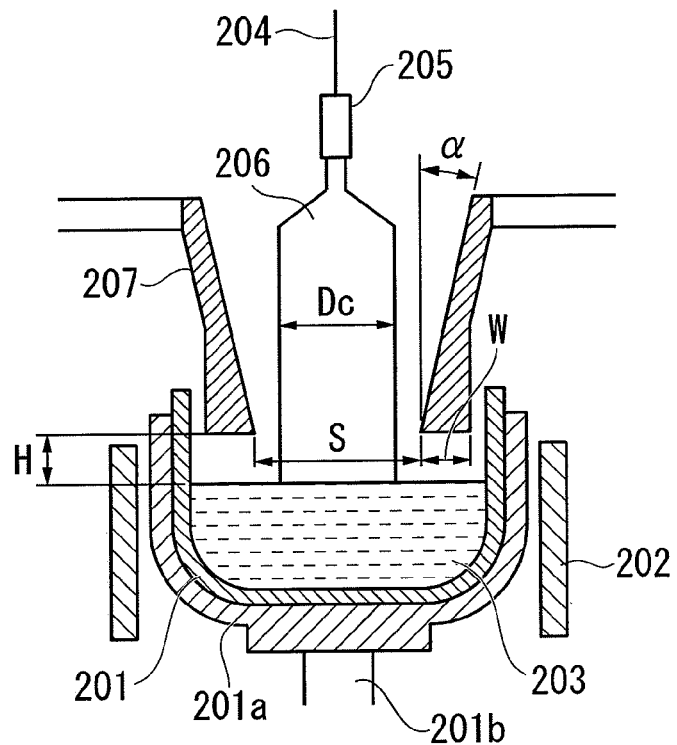
FIG. 10 is a longitudinal cross-sectional view illustrating a CZ pulling furnace used to manufacture a single crystal silicon used for the second silicon substrate.

FIG. 10 is a longitudinal cross-sectional view illustrating a CZ furnace suitable to describe a method of producing a single crystal silicon according to this embodiment. The CZ furnace includes a vitreous silica crucible (crucible) 201 that is arranged at the center in a chamber and a heater 202 that is arranged outside the crucible 201. The crucible 201 has a double structure in which an outer graphite crucible 201a holds an inner vitreous silica crucible 201 having a raw material melt 203 contained therein, and is rotated and moved up and down by a supporting shaft 201b called a pedestal. A cylindrical thermal shield 207 is provided above the crucible 201.

The outer shell of the thermal shield 207 is made of graphite, and the thermal shield has graphite felt filled therein. The thermal shield 207 has a tapered inner surface having a diameter that is gradually reduced from the upper end to the lower end. The upper outer surface of the thermal shield 207 has a tapered shape corresponding to the tapered inner surface, and the lower outer surface thereof is substantially straight such that the thickness of the thermal shield 207 is gradually increased downward.

The CZ furnace can grow a 300-mm single crystal having a target diameter Dc of, for example, 310 mm and a body length of, for example, 1200 mm.

The thermal shield 207 has the following dimensions. The outside diameter of a portion that is placed in the crucible is, for example, 570 mm, the minimum inside diameter S of the lowermost portion is, for example, 370 mm, and the width W of the thermal shield in the radial direction is, example, 100 mm. In addition, the inclination angle α of the inner surface of an inverted truncated cone in the vertical direction is, for example, 21°, the outside diameter of the crucible 201 is, for example, 650 mm, and a height H from a melt surface of the lower end of the thermal shield 207 is, for example, 60 mm.

Next, a method of setting operation conditions for growing the carbon-added CZ single crystal silicon will be described.

First, for example, 250 kg of high-purity polycrystal silicon are placed into the crucible, and an n type dopant (phosphorus (P)) is added at a concentration that allows the resistivity of the single crystal silicon to correspond to an n type.

In this embodiment, a dopant is added to a silicon melt such that the carbon concentration is in the above-mentioned range. The same material as that in the first embodiment is used as the dopant.

Further, for example, the crystal rotation speed, the crucible rotation speed, heating conditions, and magnetic field conditions are controlled to obtain the above-mentioned oxygen concentration.

The internal pressure of the furnace is set to be greater than or equal to 1.33 kPa and less than or equal to 26.7 kPa (greater than or equal to 10 torr and less than or equal to 200 torr), which is a reduced pressure range, in an inert gas atmosphere. In addition, 3 vol % or more and 20 vol % or less of hydrogen gas is mixed with an inert gas (for example, Ar gas) and the mixed gas is introduced into the furnace. The pressure is preferably greater than or equal to 1.33 kPa (10 torr), more preferably greater than or equal to 4 kPa and less than or equal to 26.7 kPa (greater than or equal to 30 torr and less than or equal to 200 torr), and most preferably greater than or equal to 4 kPa and less than or equal to 9.3 kPa (greater than or equal to 30 torr and less than or equal to 70 torr).

When the partial pressure of hydrogen is lowered, the concentration of hydrogen in the melt and crystal is lowered. Therefore, the lower limit of the pressure is defined in order to prevent the lowering of the hydrogen concentration. When the internal pressure of the furnace is increased, the gas flow rate on the melt of an inert gas, such as Ar, is lowered. Then, a reactant gas, such as carbon degassed from a carbon heater or a carbon member or SiO evaporated from a melt, is not easily exhausted, and the concentration of carbon in crystal is greater than a desired value. In addition, SiO is agglutinated on an inner portion of the furnace that is above the melt and has a temperature of about 1100° C. or less, and dust is generated and falls into the melt. As a result, crystal dislocation occurs. Therefore, the upper limit of the pressure is defined in order to prevent crystal dislocation.

Then, silicon is heated and melted by the heater 202 to obtain a melt 203. Then, a seed crystal held by a seed chuck 205 is immersed in the melt 203, and the crucible 201 and a pulling shaft 204 are rotated to pull a crystal. Any one of the {100}, {11}, and {110}-oriented crystals is used, and seed-narrowing is performed to remove crystal dislocation. Then, a shoulder portion is formed, and the shoulder portion is changed to obtain a target body diameter of, for example, 310 mm.

Thereafter, a body portion having a diameter of, for example, 1200 mm is grown at a constant pulling speed, and the body portion is compressed under the normal conditions. Then, tail-narrowing is performed, and the crystal growth operation is completed. In this case, the pulling speed is appropriately determined depending on, for example, resistivity, the diameter of a single crystal silicon, and the hot zone structure (thermal environment) of the single crystal pulling apparatus used. For example, qualitatively, a pulling speed including the range in which an OSF ring is generated in a single crystal plane can be used. The lower limit of the pulling speed may be greater than or equal to the pulling speed that generates the OSF ring region in the single crystal plane but does not generate a dislocation cluster.

The concentration of hydrogen in the inert atmosphere may be greater than or equal to 3% and less than or equal to 20% with respect to the internal pressure of the furnace that is greater than or equal to 4.0 kPa and less than or equal to 9.33 kPa (greater than or equal to 30 torr and less than or equal to 70 torr). The internal pressure of the furnace is preferably equal to or greater than 1.33 kPa (10 torr), more preferably greater than or equal to 4.0 kPa and less than or equal to 26.7 kPa (greater than or equal to 30 torr and less than or equal to 200 torr), and most preferably greater than or equal to 4.0 kPa and less than or equal to 9.3 kPa (greater than or equal to 30 torr and less than or equal to 70 torr).

When the partial pressure of hydrogen is lowered, the concentration of hydrogen in a melt and crystal is lowered. Therefore, the lower limit of the pressure is defined in order to prevent the lowering of the hydrogen concentration. When the internal pressure of the furnace is increased, the gas flow rate on the melt of an inert gas, such as Ar, is lowered. Then, a reactant gas, such as carbon degassed from a carbon heater or a carbon member or SiO evaporated from a melt, is not easily exhausted, and the concentration of carbon in crystal is greater than a desired value. In addition, SiO is agglutinated on an inner portion of the furnace that is above the melt and has a temperature of about 1100° C. or less, and dust is generated and falls into the melt. As a result, crystal dislocation occurs. Therefore, the upper limit of the pressure is defined in order to prevent crystal dislocation. It is preferable that the partial pressure of hydrogen be greater than or equal to 40 Pa and less than or equal to 400 Pa.

When silicon growth is performed in an inert atmosphere including hydrogen, the concentration of hydrogen in the single crystal silicon can be controlled by the partial pressure of hydrogen in the atmosphere. When hydrogen is introduced into a crystal, hydrogen in the atmosphere is dissolved in a silicon melt and becomes a normal (equilibrium) state. In addition, in order to introduce hydrogen to a crystal, hydrogen concentrations in a liquid phase and a solid phase are distributed by concentration segmentation during congelation.

The concentration of hydrogen in a melt is determined depending on the partial pressure of hydrogen in a gas phase by Henry's law. The concentration of hydrogen in the crystal immediately after congelation can be controlled to a desired constant value in the axial direction of the crystal by controlling the partial pressure of hydrogen in the atmosphere.

According to the single crystal silicon growing method, since a single crystal silicon is pulled in an inert atmosphere including hydrogen, COP and a dislocation cluster are not included in the entire region of a crystal in the diametric direction. In addition, since the single crystal silicon is pulled while widening the range of a PI region pulling speed capable of pulling a single crystal in an interstitial silicon-dominated region (PI region), a straight portion of the single crystal can become the interstitial silicon-dominated region (PI region) without a dislocation cluster. In addition, the width of the OSF ring is reduced. In the related art, when a grown-in defect-free single crystal is pulled, the PI region pulling speed needs to be set in a very narrow range. However, in this embodiment, it is possible to very easily grow a grown-in defect-free single crystal at a pulling speed that is greater than that of the related art. In addition, when a single crystal silicon is pulled when an OSF ring region is generated in the crystal plane, it is possible to decrease the width of the OSF ring and reduce the influence of the OSF ring.

In this embodiment, the PI region pulling speed range in a hydrogen atmosphere is compared with that in an inert atmosphere without hydrogen when the value of a temperature gradient G in the axial direction of a crystal immediately after congelation does not vary.

Figure 11:
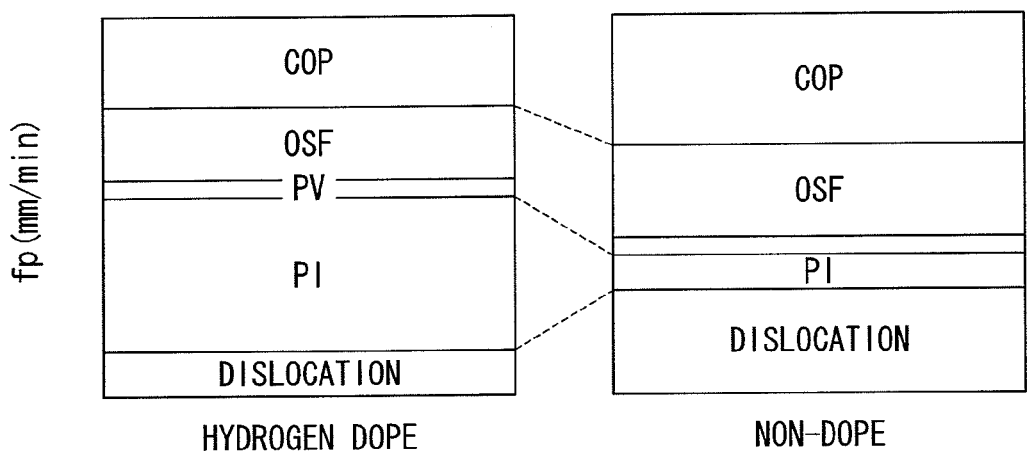
FIG. 11 is a diagram schematically illustrating a variation in pulling speed range due to the addition of hydrogen when the single crystal silicon used for the second silicon substrate is manufactured.

Specifically, in the hydrogen atmosphere, the PI region pulling speed range capable of pulling a grown-in defect-free single crystal that is composed of an interstitial-silicon-type grown-in defect-free region (PI region) is four times or more than that in the atmosphere without hydrogen. For example, as shown in FIG. 11, in the hydrogen atmosphere (hydrogen is doped), the PI region pulling speed has a margin that is 4.5 times that in the atmosphere without hydrogen (non-doped). Therefore, the above-mentioned pulling speed range makes it possible to pull a desired single crystal in the hydrogen atmosphere.

In this case, it is possible to reduce the region in which the OSF ring is generated. In addition, the size of a PV region (vacancy-type grown-in defect-free region) does not vary by the addition of hydrogen.

In this embodiment, as described above, the addition of hydrogen makes it easy to pull a grown-in defect-free single crystal, and the addition of carbon makes it possible to reduce the influence of the OSF ring. Therefore, when an epitaxial layer is grown on the wafer, defects caused by the OSF ring can be reduced and a single crystal having a desired quality can be pulled by the synergetic effect of the addition of hydrogen and the addition of carbon. As a result, operating efficiency is improved, and it is possible to significantly reduce the manufacturing cost of a single crystal silicon or a silicon substrate manufactured from the single crystal silicon.

As described above, in this embodiment, as shown in FIG. 13, the heat treatment step S2 for obtaining a gettering effect is performed on the silicon substrate 21 having the above-mentioned carbon and oxygen concentrations before the ion implantation step (implantation step) S3. Therefore, it is possible to obtain sufficient gettering capability to correspond to the occurrence of contamination in the ion implantation step in which heavy metal contamination is more likely to occur.

In addition, even when metal contamination occurs in a step after the heat treatment step S2 for obtaining a gettering effect, particularly, even when metal contamination occurs in the device step S6, it is possible to maintain sufficient gettering capability to correspond to metal contamination.

Furthermore, the heat treatment step S2 for obtaining a gettering effect may be performed in any stage before the device step S6. In this case, even when metal contamination occurs in a step after the heat treatment step S2 for obtaining a gettering effect, it is possible to maintain sufficient gettering capability to correspond to metal contamination.

The method of manufacturing a silicon substrate according to the second embodiment includes the steps of: pulling a single crystal silicon having an n type dopant concentration corresponding to a resistivity that is greater than or equal to $8 \times 10^{-3}$ Ωcm and less than or equal to $10 \times 10^{-3}$ Ωcm, a carbon concentration that is greater than or equal to $0.5 \times 10^{16}$ atoms/cm$^3$ and less than or equal to $1.6 \times 10^{17}$ atoms/cm$^3$, and an oxygen concentration that is greater than or equal to $1.4 \times 10^{18}$ atoms/cm$^3$ and less than or equal to $1.6 \times 10^{18}$ atoms/cm$^3$ using a CZ method; and slicing the pulled single crystal silicon into a silicon substrate and performing a heat treatment on the silicon substrate to form an oxygen precipitate.

The carbon concentration is preferably greater than or equal to $0.5 \times 10^{16}$ atoms/cm$^3$ and less than or equal to $1.6 \times 10^{17}$ atoms/cm$^3$ and more preferably greater than or equal to $1.0 \times 10^{16}$ atoms/cm$^3$ and less than or equal to $1.6 \times 10^{17}$ atoms/cm$^3$.

The heat treatment for forming an oxygen precipitate may be performed at a temperature greater than or equal to 600° C. and less than or equal to 800° C. for a process time that is greater than or equal to 0.25 hours and less than or equal to 3 hours in a mixed atmosphere of oxygen and an inert gas, such as argon or nitrogen.

In addition, in this embodiment of the present invention, the method of manufacturing a silicon substrate further includes the step of forming a silicon epitaxial layer having an n type dopant concentration corresponding to a resistivity that is greater than or equal to 0.1 Ωcm and less than or equal to 100 Ωcm on the sliced silicon substrate, before the heat treatment for forming an oxygen precipitate is performed.

Further, in this embodiment of the present invention, when the single crystal silicon is grown, hydrogen may be added to an inert gas atmosphere. In this case, in the single crystal silicon pulling step, the pressure of the inert gas atmosphere having hydrogen added thereto may be greater than or equal to 1.33 kPa and less than or equal to 26.7 kPa, which is a reduced pressure range, and the concentration of hydrogen gas in the atmosphere may be greater than or equal to 3 vol % and less than or equal to 20 vol %.

In addition, this embodiment of the present invention provides a second silicon substrate manufactured by the above-mentioned manufacturing method. Among BMDs serving as intrinsic gettering sinks, the density of the BMDs having a size greater than or equal to 10 nm and less than or equal to 100 nm is greater than or equal to $1.0 \times 10^6$ BMDs/cm$^3$ and less than or equal to $1.0 \times 10^{11}$ BMDs/cm$^3$.

Further, this embodiment may provide a silicon substrate for a solid-state imaging device. The silicon substrate includes a gettering layer that is provided immediately below a buried photodiode of the solid-state imaging device and has a BMD density that is greater than or equal to $1.0 \times 10^6$ BMDs/cm$^3$ and less than or equal to $1.0 \times 10^{11}$ BMDs/cm$^3$. In this case, the BMDs have a size greater than or equal to 10 nm and less than or equal to 100 nm. A silicon epitaxial layer having an n type dopant concentration corresponding to a resistivity that is greater than or equal to 0.1 Ωcm and less than or equal to 100 Ωcm is formed immediately on the silicon substrate manufactured by the above-mentioned manufacturing method. In addition, the gettering layer may be provided immediately below the epitaxial layer.

The inventors examined a technique capable of preventing heavy metal contamination in a silicon substrate.

First, the present invention examined a gettering method using carbon ion implantation. The examination results provided that a gettering effect by carbon implantation was generally obtained from an oxide precipitated due to the distortion (strain) of a silicon lattice caused by ion implantation with high energy; and since the strain of the lattice was concentrated on an ion-implanted narrow region and strain was likely to occur around an oxide during a high-temperature heat treatment in the device step, a gettering effect was insufficient particularly in the heat treatment of the device step.

The inventors examined in detail the operation of carbon contributing to the formation of gettering sinks in the silicon substrate. As the result of the examination, carbon was dissolved in the silicon lattice so as to be substituted for silicon, without forcibly introducing carbon by ion implantation. The examination results proved that, in this method, a carbon/oxygen-based precipitate involving dislocation could be formed at the substitution position with high density in, for example, the device step and a high gettering effect was obtained by the carbon/oxygen-based precipitate. In addition, the examination results proved that the substitution was caused by carbon or oxygen dissolved in a single crystal silicon.

The inventors analyzed and examined the states and actions of carbon, oxygen, and boron. The examination results proved that, when a single crystal silicon was pulled under the conditions of an n type dopant concentration corresponding to a resistivity greater than or equal to $8 \times 10^{-3}$ Ωcm and less than or equal to $10 \times 10^{-3}$ Ωcm, a carbon concentration greater than or equal to $0.5 \times 10^{16}$ atoms/cm$^3$ and less than or equal to $1.6 \times 10$ atoms/cm$^3$, and an oxygen concentration greater than or equal to $1.4 \times 10^{18}$ atoms/cm$^3$ and less than or equal to $1.6 \times 10^{18}$ atoms/cm$^3$, thereby obtaining a wafer, an epitaxial layer was formed on the wafer, and a heat treatment was performed at a temperature greater than or equal to 600° C. and less than or equal to 800° C., it was possible to form a silicon substrate having sufficient BMD size and density to form gettering sinks required to getter heavy metal and sufficient gettering capability.

Further, in this embodiment of the present invention, when the concentration of carbon added to an n type dopant-added silicon crystal is greater than or equal to $0.5 \times 10^{16}$ atoms/cm$^3$ and less than or equal to $1.6 \times 10^{16}$ atoms/cm$^3$, gettering sinks having carbon and oxygen as nuclei are formed during a crystal growth process. Even when a high-temperature heat treatment is performed, these gettering sinks stably exist. Therefore, these gettering sinks exist even after epitaxial growth. Thus, oxide precipitates act as precipitate nuclei immediately after epitaxial growth, and the nuclei are grown during a treatment process of the device step and serve as gettering sinks for heavy metal contamination during the heat treatment of the device step.

The second silicon substrate according to this embodiment of the present invention is suitable to be used for a silicon substrate for a solid-state imaging device. However, the second silicon substrate can be applicable for any substrate requiring high gettering capability.

For example, the second silicon substrate according to this embodiment of the present invention can be used as a wafer for a multi chip package (MCP), such as NAND-FLASH or NOR-FLASH. In this case, since the device structure is CMOS, it is also possible to maintain high gettering capability in the following concentration ranges: an n type dopant concentration corresponding to a resistivity that is greater than or equal to $8 \times 10^3$ Ωcm and less than or equal to $10 \times 10^{-3}$ Ωcm; a carbon concentration that is greater than or equal to $0.5 \times 10^{16}$ atoms/cm$^3$ and less than or equal to $1.6 \times 10^{17}$ atoms/cm$^3$; and an oxygen concentration that is greater than or equal to $1.4 \times 10^{18}$ atoms/cm$^3$ and less than or equal to $1.6 \times 10^{18}$ atoms/cm$^3$.

Furthermore, the second silicon substrate for a solid-state imaging device according to this embodiment includes a gettering layer that is formed immediately below a buried photodiode of the solid-state imaging device and has high gettering efficiency of heavy metal. This embodiment also provides a method of manufacturing a second silicon substrate for a solid-state imaging device. The method includes the steps of: forming a silicon substrate with a carbon-added CZ crystal; forming an n+ implantation layer and an n epitaxial layer on the silicon substrate; and forming a gettering sink immediately below the epitaxial layer.

In this embodiment, carbon is added to a CZ crystal, gettering sinks are formed immediately below the n+ implantation layer using a solid-state imaging device manufacturing process (heat treatment process), and heavy metal contamination is removed in the device step. Therefore, it is possible to improve the quality of a solid-state imaging device, such as electrical characteristics.

This embodiment also provides a second silicon substrate for a solid-state imaging device that includes a gettering layer that is formed immediately below a buried photodiode of the solid-state imaging device. In this way, it is possible to improve the gettering efficiency of heavy metal. In addition, this embodiment also provides a method of manufacturing a second silicon substrate for a solid-state imaging device. The method includes the step of forming gettering sinks made of carbon and oxygen in a substrate made of a CZ crystal having a carbon concentration that is greater than or equal to $0.5 \times 10^{16}$ atoms/cm$^3$ and less than or equal to $1.6 \times 10^{17}$ atoms/cm$^3$ and an n type dopant concentration corresponding to a resistivity that is less than or equal to $10 \times 10^{-3}$ Ωcm.

Furthermore, in this embodiment, in the solid-state imaging device manufacturing step, a minute oxygen precipitate having secondary dislocation is formed with high density immediately below the epitaxial layer. The oxygen precipitate makes it possible to maintain sufficient gettering capability even in a low-temperature heat treatment process.

The second silicon substrate according to this embodiment is a silicon substrate for a solid-state imaging device that includes a gettering layer formed immediately below a buried photodiode of the solid-state imaging device and has high gettering efficiency of heavy metal. The silicon substrate is made of a CZ crystal having carbon added thereto. A method of manufacturing a second silicon substrate for a solid-state imaging device according to this embodiment includes the step of forming gettering sinks in a silicon substrate having a carbon concentration that is greater than or equal to $0.5 \times 10^{16}$ atoms/cm$^3$ and less than or equal to $1.6 \times 10^{17}$ atoms/cm$^3$ and an oxygen concentration that is greater than or equal to $1.4 \times 10^{18}$ atoms/cm$^3$ and less than or equal to $1.6 \times 10^{18}$ atoms/cm$^3$.

In this embodiment, when a heat treatment process is performed at a temperature that is greater than or equal to 600° C. and less than or equal to 700° C., it is also possible to form a high-density oxygen precipitate immediately below the epitaxial layer and obtain high gettering capability. Therefore, when the substrate is used to manufacture a solid-state imaging device, it is possible to improve electrical characteristics of the solid-state imaging device. As a result, it is possible to improve the yield of a solid-state imaging device.

In the silicon substrate for a solid-state imaging device according to this embodiment of the present invention, carbon is added to a CZ crystal or an MCZ crystal having predetermined n type dopant concentration and oxygen concentration. Therefore, it is possible to form a carbon/oxygen precipitate having high gettering capability in the silicon substrate made of a single crystal by setting predetermined heat treatment conditions in a heat treatment process of a manufacturing step of mounting a device on the silicon substrate.

Therefore, it is possible to form gettering sinks over the entire thickness of the silicon substrate from immediately below the buried photodiode. In particular, during the device step, the diffusion of heavy metal to the device rather than to the n+ implantation layer is prevented, and the occurrence of defects in the device is prevented. As a result, it is possible to provide a high-quality solid-state imaging device with high electrical characteristics at a low cost.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of manufacturing a first silicon substrate, comprising:
    a preparation step of growing a single crystal silicon that is doped with phosphorus (P) and has a carbon concentration that is greater than or equal to $1.0 \times 10^{16}$ atoms/cm$^3$ and less than or equal to $1.0 \times 10^{17}$ atoms/cm$^3$ and an initial oxygen concentration that is greater than or equal to $1.4 \times 10^{18}$ atoms/cm$^3$ and less than or equal to $1.6 \times 10^{18}$ atoms/cm$^3$ using a CZ method, and slicing the single crystal silicon;
    a step of forming an n+ epitaxial layer that is doped with phosphorus (P) at a concentration greater than or equal to $1.0 \times 10^{19}$ atoms/cm$^3$ on the sliced single crystal silicon; and
    a step of forming a n epitaxial layer that is doped with phosphorus (P) at a concentration greater than or equal to $1.0 \times 10^{16}$ atoms/cm$^3$ and less than or equal to $1.0 \times 10^{18}$ atoms/cm$^3$ on the n+ epitaxial layer,
    wherein the thickness of the n+ epitaxial layer is greater than or equal to 0.2 μm and less than or equal to 0.6 μm, and
    the thickness of the n epitaxial layer is greater than or equal to 2 μm and less than or equal to 10 μm.

2. A method of manufacturing a second silicon substrate, comprising:
    a preparation step of growing a single crystal silicon that is doped with phosphorus (P) and has a carbon concentration that is greater than or equal to $1.0 \times 10^{16}$ atoms/cm$^3$ and less than or equal to $1.6 \times 10^{17}$ atoms/cm$^3$ and an initial oxygen concentration that is greater than or equal to $1.4 \times 10^{18}$ atoms/cm$^3$ and less than or equal to $1.6 \times 10^{18}$ atoms/cm$^3$ using a CZ method, and slicing the single crystal silicon;
    an implantation step of implanting an n type dopant into the surface of the sliced single crystal silicon at a concentration that is greater than or equal to $1.0 \times 10^{18}$ atoms/cm$^3$ to form an n+ implantation layer; and
    an epitaxial step of forming a n epitaxial layer that is doped with an n type dopant at a concentration greater than or equal to $1.0 \times 10^{16}$ atoms/cm$^3$ and less than or equal to $1.0 \times 10^{17}$ atoms/cm$^3$ on the n+ implantation layer,
    wherein the thickness of the n+ implantation layer is greater than or equal to 0.2 μm and less than or equal to 0.6 μm, and
    the thickness of the n epitaxial layer is greater than or equal to 2 μm and less than or equal to 10 μm.

3. The method of manufacturing the second silicon substrate according to claim 2, further comprising:
    a recovery heat treatment step that is performed at a temperature greater than or equal to 950° C. and less than or equal to 1200° C. after the implantation step.

4. The method of manufacturing a silicon substrate according to claim 2, further comprising:
    a heat treatment step for obtaining a gettering effect that is performed at a temperature greater than or equal to 600° C. and less than or equal to 800° C. for a time of 15 minutes to 4 hours after the preparation step.

* * * * *